(12) United States Patent  
Tang et al.

(10) Patent No.: US 7,285,812 B2
(45) Date of Patent: Oct. 23, 2007

(54) VERTICAL TRANSISTORS

(75) Inventors: Sanh Dang Tang, Boise, ID (US); Gordon A. Haller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/934,621

(22) Filed: Sep. 2, 2004

(65) Prior Publication Data

US 2006/0043450 A1    Mar. 2, 2006

(51) Int. Cl.
*H01L 29/76* (2006.01)

(52) U.S. Cl. ............... 257/296; 257/301; 257/302; 257/401

(58) Field of Classification Search ......... 257/302, 257/296, 301, 401
See application file for complete search history.

(56) References Cited

U.S. PATENT DOCUMENTS

| 3,941,629 | A | 3/1976 | Jaffe |
|---|---|---|---|
| 4,139,442 | A | 2/1979 | Bondur et al. |
| 4,333,964 | A | 6/1982 | Ghezzo |
| 4,472,459 | A | 9/1984 | Fisher |
| 4,508,757 | A | 4/1985 | Fabricius et al. |
| 4,551,910 | A | 11/1985 | Patterson |
| 4,615,762 | A | 10/1986 | Jastrzebski et al. |
| 4,630,356 | A | 12/1986 | Christie et al. |
| 4,746,630 | A | 5/1988 | Hui et al. |
| 4,789,560 | A | 12/1988 | Yen |
| 4,903,344 | A | 2/1990 | Inoue |
| 4,959,325 | A | 9/1990 | Lee et al. |
| 4,965,221 | A | 10/1990 | Dennison et al. |
| 5,041,898 | A | 8/1991 | Urabe et al. |
| 5,057,449 | A | 10/1991 | Lowrey et al. |
| 5,087,586 | A | 2/1992 | Chan et al. |
| 5,128,274 | A | 7/1992 | Yabu et al. |
| 5,149,669 | A | 9/1992 | Hosaka |
| 5,210,046 | A | 5/1993 | Crotti |
| 5,252,504 | A | 10/1993 | Lowrey et al. |
| 5,260,229 | A | 11/1993 | Hodges et al. |
| 5,316,966 | A | 5/1994 | Van Der Plas et al. |
| 5,358,894 | A | 10/1994 | Fazan et al. |

(Continued)

FOREIGN PATENT DOCUMENTS

JP    53-148389    12/1978

(Continued)

OTHER PUBLICATIONS

"Notes from IEDM, part 3," http://www.thilmfilmmfg.com/Noteworthy/Noteworthy01/IEDM12Dec01.htm, 2 pages (Dec. 12, 2001).

(Continued)

*Primary Examiner*—Edward Wojciechowicz
(74) *Attorney, Agent, or Firm*—Knobbe, Martens, Olson & Bear, LLP

(57) ABSTRACT

Vertical transistors for memory cells, such as 4F2 memory cells, are disclosed. The memory cells use digit line connections formed within the isolation trench to connect the digit line with the lower active area. Vertical transistor pillars can be formed from epitaxial silicon or etched from bulk silicon. Memory cells can be formed by creating a cell capacitor electrically connected to each transistor pillar.

19 Claims, 30 Drawing Sheets

U.S. PATENT DOCUMENTS

| | | | |
|---|---|---|---|
| 5,409,563 | A | 4/1995 | Cathey |
| 5,416,350 | A | 5/1995 | Watanabe |
| 5,438,016 | A | 8/1995 | Figura et al. |
| 5,457,067 | A | 10/1995 | Han |
| 5,458,999 | A | 10/1995 | Szabo et al. |
| 5,466,632 | A | 11/1995 | Lur et al. |
| 5,468,675 | A | 11/1995 | Kaigawa |
| 5,607,874 | A | 3/1997 | Wang et al. |
| 5,747,377 | A | 5/1998 | Wu |
| 5,789,306 | A | 8/1998 | Roberts et al. |
| 5,834,359 | A | 11/1998 | Jeng et al. |
| 5,899,727 | A | 5/1999 | Hause et al. |
| 5,909,630 | A | 6/1999 | Roberts et al. |
| 6,008,106 | A | 12/1999 | Tu et al. |
| 6,097,065 | A | 8/2000 | Forbes et al. |
| 6,104,068 | A | 8/2000 | Forbes |
| 6,150,687 | A | 11/2000 | Noble et al. |
| 6,172,391 | B1 | 1/2001 | Goebel et al. |
| 6,306,727 | B1 | 10/2001 | Akram |
| 6,320,222 | B1 | 11/2001 | Forbes et al. |
| 6,350,635 | B1 | 2/2002 | Noble et al. |
| 6,355,961 | B1 | 3/2002 | Forbes |
| 6,376,317 | B1 | 4/2002 | Forbes et al. |
| 6,377,070 | B1 | 4/2002 | Forbes |
| 6,399,979 | B1 | 6/2002 | Noble et al. |
| 6,413,825 | B1 | 7/2002 | Forbes |
| 6,414,356 | B1 | 7/2002 | Forbes et al. |
| 6,424,001 | B1 | 7/2002 | Forbes et al. |
| 6,448,601 | B1 | 9/2002 | Forbes et al. |
| 6,492,233 | B2 | 12/2002 | Forbes et al. |
| 6,496,034 | B2 | 12/2002 | Forbes et al. |
| 6,504,201 | B1 | 1/2003 | Noble et al. |
| 6,531,727 | B2 | 3/2003 | Forbes et al. |
| 6,537,870 | B1* | 3/2003 | Shen .................. 438/243 |
| 6,559,491 | B2 | 5/2003 | Forbes et al. |
| 6,566,682 | B2 | 5/2003 | Forbes |
| 6,639,268 | B2 | 10/2003 | Forbes et al. |
| 6,664,806 | B2 | 12/2003 | Forbes et al. |
| 6,670,642 | B2 | 12/2003 | Takaura et al. |
| 6,734,482 | B1 | 5/2004 | Tran et al. |
| 6,734,484 | B2 | 5/2004 | Wu |
| 6,756,625 | B2 | 6/2004 | Brown |
| 6,797,573 | B2 | 9/2004 | Brown |
| 6,798,009 | B2 | 9/2004 | Forbes et al. |
| 6,801,056 | B2 | 10/2004 | Forbes |
| 6,806,137 | B2 | 10/2004 | Tran et al. |
| 6,808,979 | B1 | 10/2004 | Lin et al. |
| 6,964,895 | B2 | 11/2005 | Hsu |
| 2002/0030214 | A1 | 3/2002 | Horiguchi |
| 2003/0001290 | A1* | 1/2003 | Nitayama et al. ......... 257/907 |
| 2003/0227072 | A1 | 12/2003 | Forbes et al. |
| 2005/0079721 | A1* | 4/2005 | Buerger et al. ........... 438/696 |
| 2005/0145913 | A1* | 7/2005 | Katsumata et al. ........ 257/301 |

FOREIGN PATENT DOCUMENTS

| | | |
|---|---|---|
| JP | 60-167349 | 8/1985 |
| JP | 1-100948 | 4/1989 |
| JP | 2-219253 | 8/1990 |
| JP | 4-130630 | 5/1992 |
| JP | 4-162528 | 6/1992 |

OTHER PUBLICATIONS

"Quantum confinement effects in a 3D FinFET transistor," http://www.ise.com/appex/FinFET/FinFET.html, 5 pages (Jan. 15, 2003).

Clarke, Peter, "ISSCC: Vertical transistor structures considered," EE Times Website, http://www.eetimes.com, 3 pages (Feb. 9, 2000).

Goebel et al., "Fully depeted surrounding gate transistor (SGT) for 70 nm DRAM and beyond," IEEE, 5 pages (2002).

Mandelman et al., "Challenges and future directions for the scaling of dynamic random-access memory (DRAM)," IBM J. Res. & Dev., vol. 46, No. 2/3, pp. 187-212 (Mar./May 2002).

Lau et al., "High aspect ratio submicron silicon pillars fabricated by photoassisted electrochemical etching and oxidation," Applied Physics Letters, vol. 67(13), pp. 1877-1879 (Sep. 25, 1995).

Lau et al., "High aspect ratio sub-micron silicon pillars for light emission studies and photonic band gap material application," Jun. 1995 Research Journal, Microelectronics Group, 3 pages (Jun. 1996).

Lutze et al., "Field oxide thinning in poly buffer LOCOSs isolation with jActive area spacings to 0.1 um," Journal of Electrochemical Society, vol. 137, No. 6,pp. 1867-1870 (Jun. 1990).

Seeger et al., "Fabrication of ordered array of silicon nanopillars," J. Phys. D: Appl. Phys., vol. 32, pp. L129-L132 (1999).

P.Xuan et al., "60nm planarized ultra-thin body solid phase epitaxy MOSFETs," IEEE Device Research Conf., Denver, CO, pp. 67-68, Jun. 2000.

Wolf et al., "Silicon processing for the VLSI era," vol. 1, Lattice Press, CA, USA, pp. 529-555 (1986).

P.Kalavade et al., "A novel sub-10nm transistor," IEEE Device Research Conf., Denver, CO pp. 71-72, Jun. 2000.

J.P. Denton et al., "Fully depleted dual-gate thin-film SOI p-MOSFET's fabricated in SOI islands with an isolated buried polysilicon backgate," IEEE Electron Device Lett., vol. 17, No. 11, pp. 509-511, Nov. 1996.

Xuejue Huang, et al., "Sub-50 nm P-Channel Fin FET," IEEE Transactions on Electron Devices, vol. 48, No. 5, May 2001.

J. Kedzierski, et al., "High-performance symmetric-gate and CMOS-compatible Vt asymmetric-gate FinFET devices" IEDM, 2001, paper 19.5.

K. Kim, et al., "Nanoscale CMOS Circuit Leakage Power Reduction by Double-Gate Device" International Symposium on Low Power Electronics and Design Newport Beach Marriott Hotel, Newport, California, Aug. 9-11, 2004, http://www.islped.org.

B.S. Doyle, et al., "High performance fully-depleted tri-gate CMOS transistors," IEEE Electron Device Letters, vol. 24, No. 4, Apr. 2003, pp. 263-265.

B. Doyle, et al., "Tri-Gate fully depleted CMOS transistors: fabrication, design and layout," 2003 Symposium on VLSI Technology. Digest of Technical Papers, Tokyo; Japan Soc. Applied Phys, 2003, pp. 133-134.

H. Takato, et al., "High performance CMOS surrounding gate transistor (SGT) for ultra high density LSIs," Electron Devices Meeting, 1988, Technical Digest, International, Dec. 11-14, 1988, pp. 222-225.

S. Miyano, et al., "Numerical analysis of a cylindrical thin-pillar transistor (CYNTHIA)," IEEE Transactions on Electron Devices, vol. 39, No. 8, Aug. 1992, pp. 1876-1881.

H-S P. Wong et al., "Self-aligned (top and Bottom) Double-Gate MOSFET with a 25nm Thick Silicon Channel," IEEE Int. Electron Device Meeting, 1997, pp. 437-430.

Hyun-Jin Cho, et al., "A novel Pillar DRAM cell 4 Gbit and beyond," Digest of Technical Papers Symposium on VLSI Technology, Jun. 9-11, 1998, pp. 38-39.

W. Sakamoto, et al., "A study of current drivability of SGT," Record of Electrical and Communication Engineering Conversazione Tohoku University, vol. 72, No. 2, Feb. 2004, pp. 110-111.

R. Nishi, et al., "Concave Source SGT for supressing punch-through effect," Transactions of the Institute of Electronics. Information and Communication Engineers C, vol. J86-C, No. 2, Feb. 2003, pp. 200-201.

W. Zhang, et al., :A study of load capacitance in SGT, Record of Electrical and Communication Engineering Conversazione Tohoku University, vol. 71, No. 1, Oct. 2002, pp. 473-474.

H. Yamashita, et al., "A study of process design in three dimensional SGT device," Record of Electrical and Communication Engineering Conversazione Tohoku University, vol. 71, No. 1, Oct. 2002, pp. 467-468.

C.K. Date, et al., "Suppression of the floating-body affect using SiGe layers in vertical surrounding-gate MOSFETs," IEEE Transactions on Electron Devices, vol. 48, No. 12, Dec. 2001, pp. 2684-2689.

R. Nishi, et al., "Analysis of the shape of diffusion layer of SGT for suppressing substate bias effect," *Transactions of the Institute of Electronics, Information and Communication Engineers C*, vol. J84-C, No. 10, Oct. 2001, pp. 1018-1020.

I. De, et al., "Impact of gate workfunction on device performance at the 50 nm technology node," *Solid-State Electronics*, vol. 44, No. 6, Jun. 2000, pp. 1077-1080.

Hyun-Jin Cho, et al., "High performance fully and partially depleted poly-Si surrounding gate transistors," In: 1999 *Symposium on VLSI Technology*. Digest of Technical Papers (IEEE Cat. No. 99CH 36325). Tokyo, Japan: Japan Soc. Appl. Phys, 1999, pp. 31-32.

T. Nakamura, "A study of steady-state characteristics of SGT type three-dimensional MOS transistor," *Record of Electrical and Communication Engineering Conversazione Tohoku University*, vol. 66, No. 1 Jan. 1998, pp. 211-212.

T. Endoh, et al., "Analysis of high speed operation for multi-SGT," *Transactions of the Institute of Electronics, Information and Communication Engineers* C-1, vol. J80C-I, No. 8, Aug. 1997, pp. 382-383.

T. Endoh, et al, "An accurate model of fully-depleted surrounding gate transistor (FD-SGT)," *IEICE Transactions on Electronics*, vol. E80-C, No. 7, Jul. 1997, pp. 905-910.

T. Endoh, et al., An analytic steady-state current-voltage characteristics of short channel fully-depleted surrounding gate transistor (FD-SGT), *IEICE Transactions on Electronics*, vol. E80-C, No. 7, Jul. 1997, pp. 911-917.

K. Abhinav, et al, "An analytical temperature dependent threshold voltage model for thin film surround gate SOL MOSFET," *Proceedings of the SPIE—The International Society for Optical Engineering*, vol 3975, pt. 1-2, 2000, pp. 605-608.

S. Miyamoto, et al., "Effect of LDD structure and channel poly-Si thinning on a gate-all-around TFT (GAT) for SRAM's," *IEEE Transactions on Electron Devices*, vol. 46, No. 8, Aug. 1999, pp. 1693-1698.

M. Terauchi, et al., "Depetion isolation effect of surrounding gate transistors," *IEEE Transactions on*, vol. 44, Issue 12, Dec. 1997, pp. 2303-2305.

A. Kranti, et al., "Optimisation for improved short-channel performance of surrounding/cylindrical gate MOSFETs," *Electronics Letter*, vol. 37, Issue 8, Apr. 12, 2001, pp. 533-534.

F. Matsuoka, et al., "A study of soft error in SGT DRAM," *Record of Electrical and Communication Engineering* Conversazion Tohoku University, vol. 71, No. 1, Oct. 2002, pp. 469-470, Journal Paper.

T. Endoh, et al., "The analysis of the stacked-surrounding gate transistor (S-SGT) DRAM for the high speed and low voltage operation," *IEICE Transactions on Electronics*, vol. E81-C, No. 9, Sep. 1998, pp. 1491-1498.

T. Endoh, et al., "The Stacked-SGT DRAM using 3D-building memory arry technology," *Transactions of the Institute of Electronics, Information and Communication Engineers* CI, vol. J81C-I, No. 5, May 1998, pp. 288-289.

S.J. Ahn, et al., "Examination and improvement of reading disturb characteristics of a surrounded gate STTM memory cell," In: *2003 Third IEEE Conference on Nanotechnology*. IEEE-NONO 2003. Proceedings (Cat. No. 03TH8700). Piscataway, NJ, USA: IEEE, 2003, pp. 528-530, vol. 2.

S.J. Ahn, et al., "Highly scalable and CMOS-compatible STTM cell technology," In: *IEEE International Electron Devices Meeting 2003*, Piscataway, NJ, USA: IEEE, 2003, pp. 10.4.1-10.4.4.

F. Matsuoka, et al., "Numerical analysis of alpha-particle-induced soft errors in floating channel type surrounding gate transistor (FC-SGT) DRAM cell," *Electron Devices*, IEEE Transactions on, vol. 50, Issue 7, Jul. 2003, pp. 1638-1644.

T. Endoh, et al., "2.4F2 memory cell technology with stacked-surrounding gate transistor (S-SGT) DRAM," *Electron Devices*, IEEE Transactions on vol. 48, Issue 8, Aug. 2001, pp. 1599-1603.

S. Watanabe, et al., "A novel circuit technology with surrounding gate transistors (SGT's) foru ultra high density DRAM's" *Solid-State Circuit, Journal of IEEE*, vol. 30, Issue 9, Sep. 1995, pp. 960-971.

T. Endoh, et al., "The 1.44F2 memory cell thecnology with the stacked-surrounding gate transistor (S-SGT) DRAM," *Microelectronics, 2000. Proceedings. 2000 22$^{nd}$ International Conference on*, vol. 2, May 14-17, 2000, pp. 451-454, vol. 2.

B. Goebel, et al., "Fully depleted surrounding gate transistor (SGT) for 70nm DRAM and beyond," Electron Devices Meeting, 2002. *IEDM '02 Digest*. International, Dec. 8-11, 2002, pp. 275-278.

K. Sunouchi, et al., "A surrounding gate transistor (SGT) cell for 64/256 Mbit DRAMs," Elecron Devices Meeting, 1989, *Technical Digest.*, International, Dec. 3-6, 1989, pp. 23-26.

M. Terauchi, et al., "A Surrounding Gate Transistor (SGT) Gain Cell For Ultra High Density Drams," VLSI Technology, 1993. *Digest of Technical Papers*. 1993 Symposium on, May 17-19, 1993 pp. 21-22.

M. Iwai, et al., "Buried gate type SGT flash memory," *Transactions of the Institute of Electronics, Information and Communication Engineers C*, vol. J86C, No. 5, May 2003, pp. 562-564. Journal Paper.

T. Endoh, et al., "Novel ultra high density flash memory with a stacked-surrounding gate transistor (S-SGT) structured cell," In: International Electron Devices Meeting. *Technical Digest*, IEEE, 2001, pp. 2.3.1-2.3.4.

M. Hioki, et al., "An analysis of program and erase operation for FC-SGT flash memory cells," In: *2000 International Conference on Simulation Semiconductor Processes and Devices* (Cat. No. 00TH8502). Piscataway, NJ, USA: IEEE, 2000, pp. 116-118.

T. Endoh, et al., "Floating channel type SGT flash memory," *Transactions of the Institute of Electronics, Information and Communication Engineers* C-I, vol. J82C-I, No. 3, Mar. 1999, pp. 134-135.

T. Sakai, et al., "A study of stacked-SGT-based pass-transistor logic circuit," *Recod of Electrical and Communication Engineering* Conversazione Tohoku University, vol. 73, No. 2, Feb. 2004, pp. 108-109.

S. Watanabe, "Impact of three-dimensional transistor on the pattern area reduction for ULSI," *IEEE Transaction on Electron Devices*, vol. 50, No. 10, Oct. 2003, pp. 2073-2080.

T. Endoh, et al., "A high signal swing pass-transistor logic using surrounding gate transistor," In: *2000 International Conference on Simulation Semiconductor Processes and Devices* (Cat. No. 00TH8502). Piscataway, NJ, USA: IEEE, 2000, pp. 273-275.

A. Nitayama, et al., "High speed and compact CMOS circuits with multi-pillar surrounding gate transistors," *IEEE Transactions on Electron Devices*, vol. 36, No. 11, pt. 1, Nov. 1989, pp. 2605-2606.

A. Nitayama, "Multi-pillar surrounding gate transistor (M-SGT) for compact and high-speed circuits," Electron Devices, *IEEE Transactions on*, vol. 38, Issue 3, Mar. 1991, pp. 579-583.

H. Takato, et al., "Impact of surrounding gate transistor (SGT) for ultra-high density LSI's" Electron Devices, *IEEE Transactions on*, vol. 38, Issue 3, Mar. 1991, pp. 573-578.

* cited by examiner

VERTICAL TRANSISTORS

BACKGROUND OF THE INVENTION

1. Field of the Invention

The present invention relates to the field of integrated circuit fabrication, specifically to the formation of transistors.

2. Description of the Related Art

Since the introduction of the digital computer, electronic storage devices have been a vital resource for the retention of data. Conventional semiconductor electronic storage devices, such as Dynamic Random Access Memory (DRAM), typically incorporate capacitor and transistor structures in which the capacitors temporarily store data based on the charged state of the capacitor structure. In general, this type of semiconductor Random Access Memory (RAM) often requires densely packed capacitor structures that are easily accessible for electrical interconnection.

In order to increase efficiency of memory devices, there is an effort to create smaller memory cells. DRAM memory cells can shrink in several ways. One way to decrease the size of a memory cell is to reduce the minimum feature size (F). This generally occurs through new and advanced lithography and etching techniques. Memory cells can also be decreased by designing a smaller memory cell. For example many of the DRAM chips on the market today have a memory cell size of $8F^2$ or greater, where F is the dimension of the minimum feature for a given manufacturing process.

U.S. Pat. No. 6,734,482 issued to Tran, et al., describes the use of a bit line buried within an isolation trench. The memory cell described in that patent is a $6F^2$ memory cell. A conductive strap connects the bit line to the active area (source) of a planar transistor which does not use a vertical pillar. However, these designs can take up more chip real estate.

Vertical transistor designs can be used to decrease chip real estate occupied by a memory cell transistor. An example of a memory cell with a vertical transistor is disclosed in U.S. Pat. No. 6,756,625, issued to Brown, the disclosure of which is incorporate by reference herein. In that patent, the digit line is directly connected to a pillar used in the vertical transistor. However, this can be difficult to integrate into the process flow of a DRAM memory cell. Therefore, additional methods of forming vertical transistors are desirable.

SUMMARY OF THE INVENTION

In an aspect of the invention, a memory array is disclosed. The array comprises a substrate having a plurality of ridges and trenches. A digit line is within each of the plurality of trenches. A plurality of transistor pillars overlies each of the plurality of ridges. The transistor pillars include an upper active area. A plurality of lower active areas is in an upper surface of each of the plurality of ridges. One of the lower active areas neighbors each transistor pillar. A digit line link is within each trench connecting each lower active area to one digit line. The array also includes a plurality of word lines, wherein each word line surrounds a row of transistor pillars over at least two of the plurality of ridges.

In another aspect of the invention, a method of forming an integrated circuit including a vertical transistor is disclosed. The method comprises defining a ridge region and a trench in a substrate. A digit line is formed within the trench. An insulating material is deposited in the trench to isolate the digit line. A transistor pillar is formed in the ridge region after depositing the insulating material in the trench. A portion of the digit line adjacent to the ridge region is exposed after forming the transistor pillar. A digit line stitch is created within the trench connecting the digit line to a lower active area within the ridge region after exposing the portion of the digit line. A gate surrounding the transistor pillar is formed after depositing the digit line stitch.

A method of forming a memory array is disclosed in another aspect of the invention. The method comprises forming a digit line within each of a plurality of trenches in a substrate. A plurality of transistor pillars is produced on each of a plurality of ridges in the substrate after forming the digit lines. Forming the pillars comprises forming a column of transistor pillars on each ridge and rows of transistor pillars across different ridges. A word line is formed to connect each row of transistor pillars. A plurality of exposed digit line windows is created in the trench after forming the word lines. The method further comprises forming a digit line stitch in each exposed digit line window to connect the digit lines to a lower active area of one neighboring transistor.

In another aspect of the invention, a method of forming a memory array is disclosed. The method comprises forming a plurality of trenches and a plurality of plateaus within a substrate. A digit line is deposited in each trench and the digit line is isolated within each trench. An exposed side portion of the digit line is formed and a digit line strap is deposited to connect the exposed side portion of the digit line to a plurality of lower active areas in the plateaus. The plateaus are etched to form transistor pillars and ridges in the substrate. A word line material surrounding the transistor pillars is deposited. Vertical self-alignment spacers are formed surrounding an upper portion of the transistor pillars and over the word line material. The method further comprises etching the word line material to form a plurality of word lines connecting a row of transistor pillars.

A method of forming vertical transistor pillars in a substrate is disclosed in another, aspect of the invention. The method comprises forming a plurality of buried digit lines within a plurality of trenches in a substrate. A first mask is deposited on the substrate. A plurality of holes is formed in the first mask. A second mask is deposited in the holes of the first mask. The first mask is removed after depositing the second mask. The method further comprises etching the substrate selectively to the second mask to form a plurality of pillars in the substrate above and adjacent to the buried digit lines.

In another aspect of the invention, a vertical transistor for an integrated circuit is disclosed. The transistor comprises a buried digit line within a trench in a bulk semiconductor substrate. A bulk semiconductor transistor pillar is on a ridge in the semiconductor substrate. A digit line link is in the trench connecting the buried digit line to a lower active area in the ridge. The transistor further comprises a conductive gate surrounding the transistor pillar.

DETAILED DESCRIPTION OF THE PREFERRED EMBODIMENT

In the context of this document, the term "semiconductor substrate" is defined to mean any construction comprising semiconductor materials, including, but not limited to, bulk semiconductor materials such as a semiconductor wafers, and semiconductor material layers. The term "substrate" refers to any supporting substrate, including, but not limited to, the semiconductor substrates (either alone or in assemblies comprising other materials thereon) described above. Also in the context of this document, the term "layer" encompasses both the singular and the plural unless otherwise indicated.

Processes for forming vertical surround gate transistors (VSGTs), memory cells comprising VSGTs and arrays of same are disclosed. Preferably, the memory cells have a cell size of $4F^2$. In preferred embodiments, transistors are formed without using a separate interconnect outside of the isolation trench to connect a buried digit line and a lower active area. A digit line link within the isolation trench is used to connect the digit line to the lower active area. In one embodiment, a strap running the length of the array connects the digit line to the lower active area of several transistors in a row. In another embodiment, a conductive stitch is used to separately connect the digit line to the lower active area of one transistor. Additionally by using a buried digit line in the STI trench and strapping the buried digit line to the active area, less chip real estate is used than using other digit line placements.

Strapping the Digit Line to the Lower Active Area of Several Transistors

VSGTs can be formed using epitaxially grown silicon to form the pillar surrounded by the vertical surround gate (VSG). However, epitaxially grown silicon often has high defect rates. It is challenging to overcome these defects or to form a defect free epitaxially grown silicon pillar, and also to integrate the process flow with digit line formation and contact. In one preferred embodiment, epitaxially grown silicon is not used, rather etch steps are used to define the transistor pillar. This eliminates the challenges of dealing with epitaxially-grown silicon.

Figure 11:
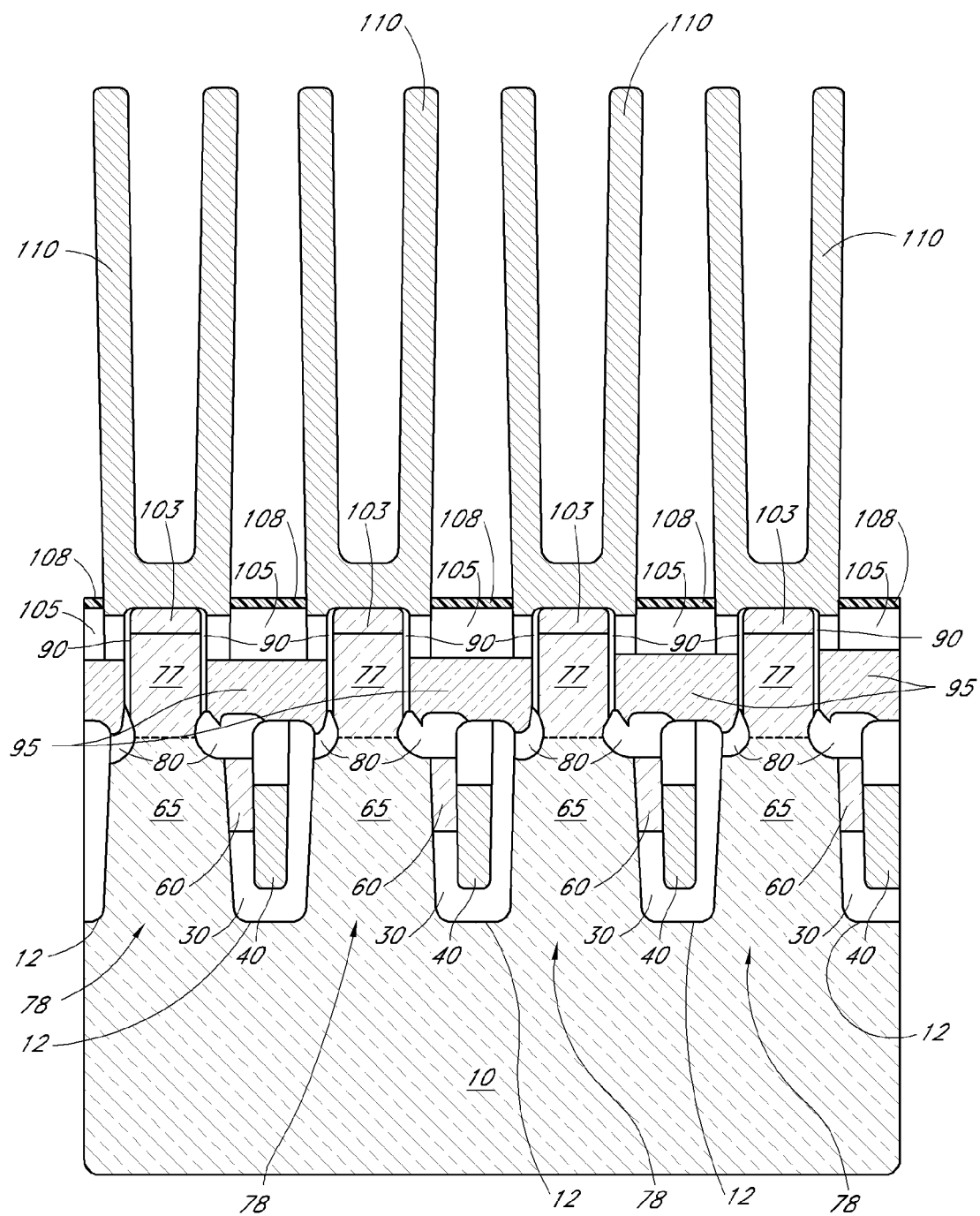
FIG. 11 is a schematic cross-section of the array of FIG. 10A after forming a lower capacitor electrode over each transistor.

In a preferred embodiment illustrated in FIG. 11, buried digit lines (BDL) 40 are placed in shallow trench isolation (STI) trenches 12 within an array 2. The buried digit lines 40 are preferably connected to a lower active area 65, which is formed in an upper surface of the substrate 10, by a strap 60 within the trench 12. By strapping the buried digit line 40 to the lower active area 65, a separate interconnect becomes unnecessary. The word line 95 is preferably positioned above the buried digit line 40.

Figure 1A:
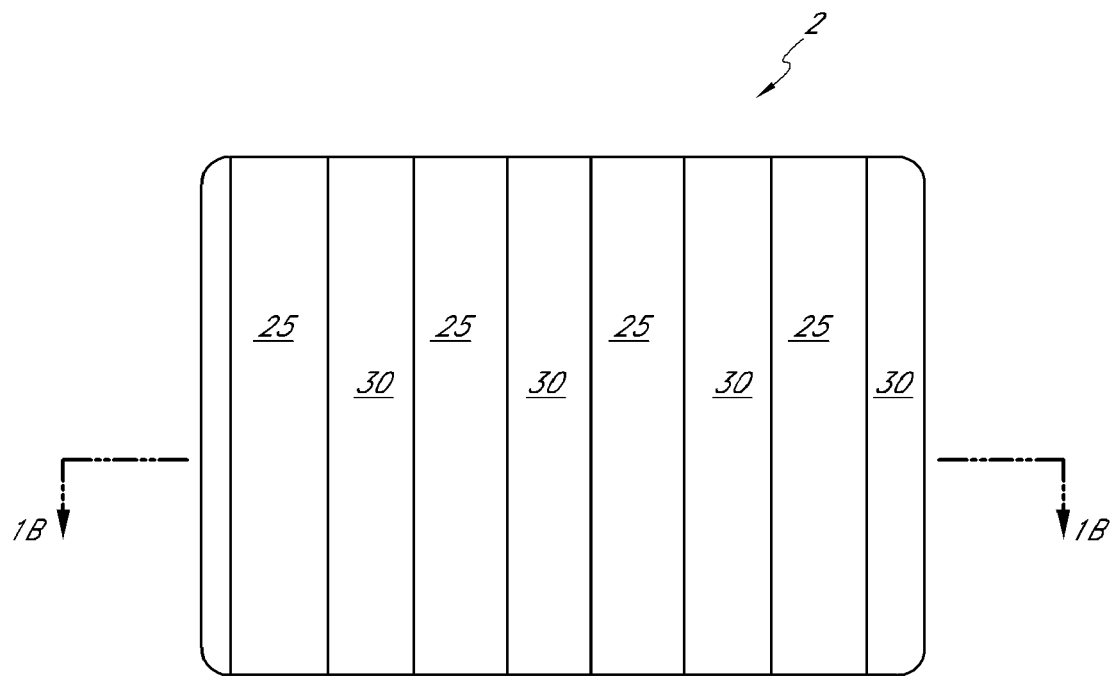
FIG. 1A is a schematic plan view of a memory array at a first stage of processing.

Referring now to FIG. 1A, a schematic planar view of a portion of an array 2 can be seen. Trenches 12 are seen lined with an insulation material 30, between a pair of cap lines 25 over the substrate 10. The trenches are filled with an insulation material 45 (FIG 1B) after depositing a digit line 40 (FIG. 1B) in each trench 12. For simplicity, FIG. 1A shows only the lining insulation material 30 within the trenches 12. Preferably the trench liner 30 and the trench filler 45 are similar materials. In a preferred embodiment, a p-well has been formed in the substrate 10 by doping the substrate 10 prior to forming the insulation trenches 12.

Figure 1B:
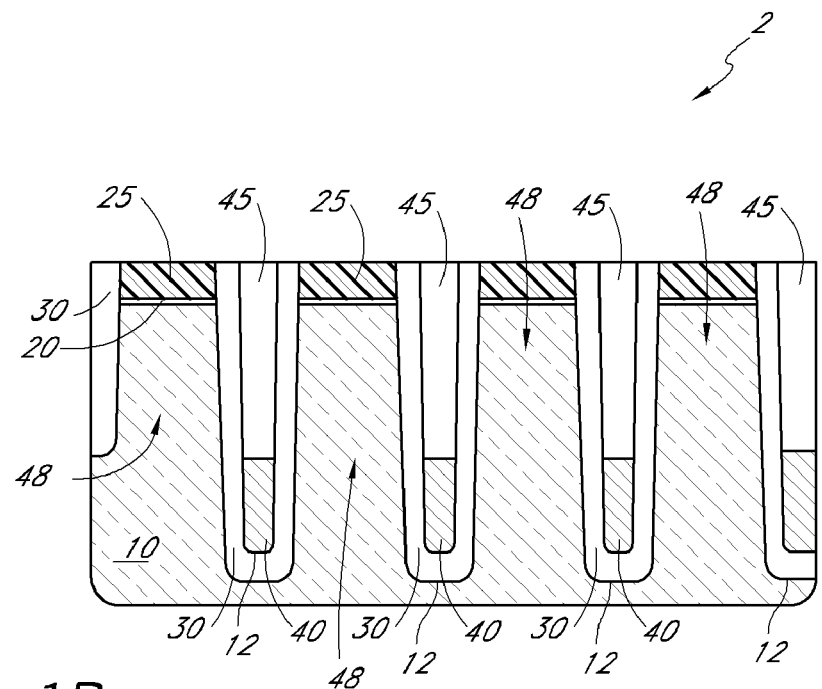
FIG. 1B is a schematic cross-section of the array of FIG. 1A along line 1B-1B of FIG. 1A.

FIG. 1B is a cross sectional schematic view of the array 2 of FIG. 1A. The substrate 10 has been masked and etched to form trenches 12 between substrate plateaus within the substrate 10. Before the substrate 10 was etched, a pad oxide 20 was formed on the surface of the substrate 10. The pad oxide 20 can be deposited by conventional depositional processes, such as chemical vapor deposition (CVD), or can be thermally grown on the surface of the substrate 10. Preferably the pad oxide 20 is between about 10 Å and 100 Å, more preferably between about 60 Å and 100 Å. Cap lines 25 are deposited over the pad oxide 20. Preferably, the cap lines 25 are a CVD grown silicon nitride layer with a thickness of between about 200 Å and 800 Å, more preferably between about 400 Å and 600 Å.

After the pad oxide 20 and the cap lines 25 have been formed, the trenches 12 are masked and etched. Various masking techniques can be used to form the trenches 12, including traditional photolithography and hard masks. Preferably, the trench depth will include an allowance for the height of a silicon pillar that will be used to form a vertical transistor, as well as a buried bit line within the trenches 12. Preferably the trench depth will be between about 5500 Å and 8000 Å, more preferably between about 6000 Å and 7500 Å.

Once the trenches 12 have been formed in the substrate 10, an insulation liner 30 is formed over the surface of the array 2. Preferably, the lower layer of insulation material 30, preferably oxide, is a TEOS (tetraethyl orthosilicate) oxide. Preferably, the initial layer of trench oxide 30 is formed over the entire array 2 and has a thickness of between about 50 Å and 300 Å, more preferably between about 100 Å and 200 Å and lines the trenches 12 without filling.

A conductive line that will form the buried digit 40 is formed within each trench 12. In a preferred embodiment, the buried digit line 40 is a conductor, more preferably a metal or a metal alloy, such as tungsten silicide (WSi$_x$). Preferably, the metal is deposited conformally over the liner 30 by a CVD process or an atomic layer deposition (ALD) process. ALD processes allow for the formation of highly conformal layers.

Once the metal for the buried digit line 40 is deposited, a blanket etch is performed to recess the metal that will become the buried digit line 40, preferably etching down to between about 3000 Å and 4000 Å below the pad oxide 20. After the buried digit line 40 is recessed a second layer of trench insulator 45 is used to fill the remainder of the trench 12. Preferably, the second layer of trench insulator 45 is formed similarly to the liner 30 and supplements the insulating capabilities of the liner 30. Preferably, the insulator 45 is an oxide, more preferably a CVD TEOS oxide or a spin-on oxide. A chemical mechanical polish (CMP) step or other planarizing step is performed to planarize the surface of the array 2 by removing excess materials over the height of the caps 25. The CMP step preferably is a stop-on-nitride process and stops on the cap layer 25. Preferably, after the CMP step, the insulator 45 is between about 3250 Å to 4500 Å thick over the digit line 40. While the insulator 45 is shown in FIG. 1B, the first and second layers of insulator 30, 45 are also referred to as one trench insulator 30 for convenience, and labeled as such in FIG. 1A and other figures.

Figure 2A:
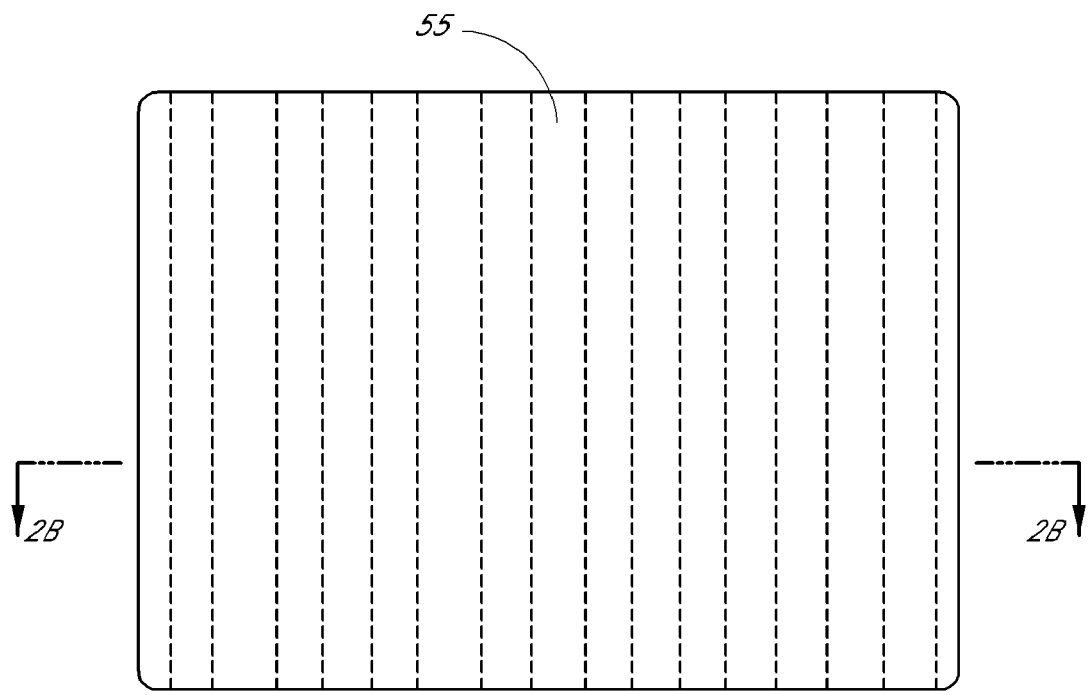
FIG. 2A is a schematic plan view of the memory array of FIG. 1A after removing part of the trench oxide and depositing a space holder.
Figure 2B:
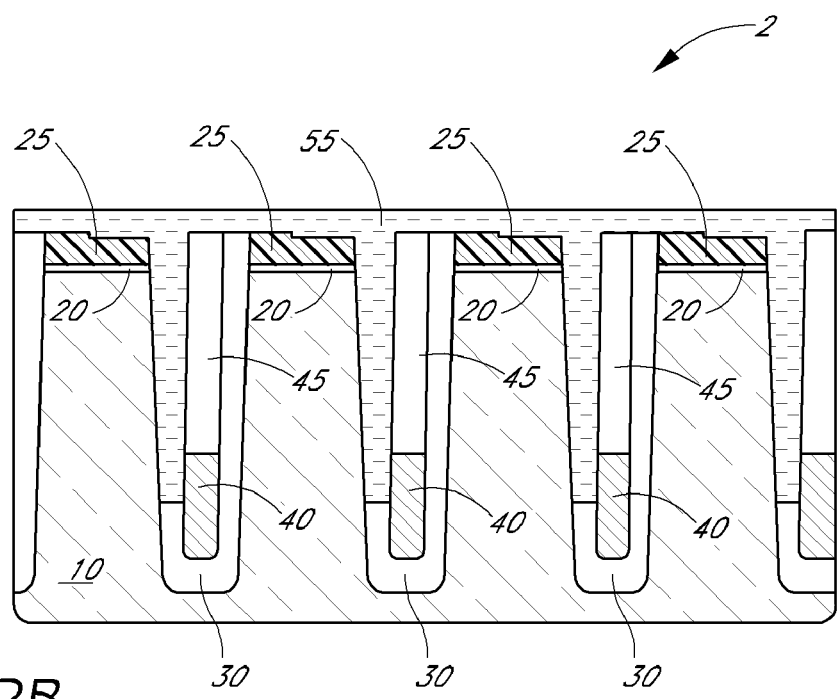
FIG. 2B is a schematic cross-section of the array of FIG. 2A along line 2B-2B of FIG. 2A.

With reference to FIGS. 2A and 2B, once the trench insulator 30 is formed, a mask is formed over the array 2. Preferably a resist mask is formed to remove one side of the trench oxide 30. The opening of a slot along one side and within the trench oxide 30 will help in the formation of a strap that will eventually connect the buried digit line 40 to a lower active area.

Preferably, the etch process is selective to oxide and selective against silicon, nitrides, and metals. The resist mask may also cover a portion of the cap layer 25, but as the cap layer 25 is preferably not etched when removing a portion of the trench oxide 30, whether the cap layer 25 is masked is not particularly important. The trench oxide 30 can be etched all the way to the base of the trench 12 or the etch process can stop before the base of the trench 12. Preferably, a substantial portion of the buried digit line 40 has been exposed by etching the trench oxide 30. Preferably, the oxide 30 is etched on one side to a height of between about 0 Å and 2000 Å from the base of the trench 12. In the embodiment illustrated in FIG. 2B, the trench oxide 30 is etched to a point about halfway along the height of the buried digit line 40.

FIGS. 2A and 2B illustrate the deposition of a space holder 55 to fill the narrow trenches 12 that were exposed when the trench oxide 30 was etched. Preferably the space holder 55 is a thin non-photo sensitive resist or organic layer, such as a conventional bottom anti-reflective coating (BARC) layer. BARC is used because it is easily removable selective to neighboring layers, but other materials could also be used. The space holder 55 is preferably blanket deposited over the array 2.

Figure 3A:
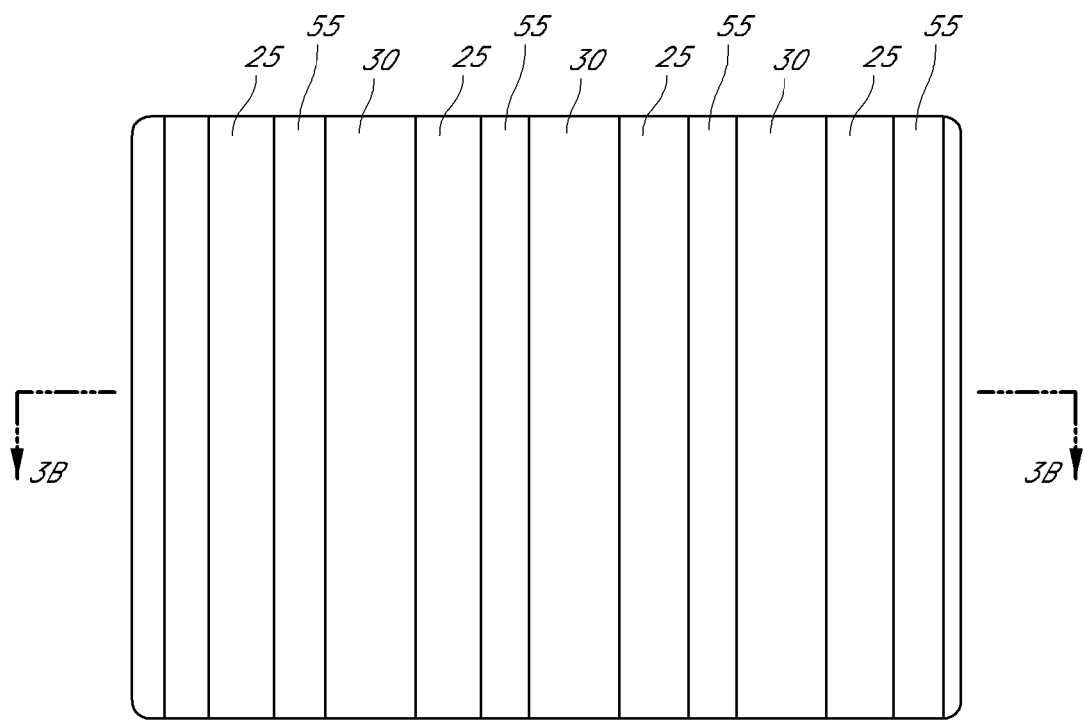
FIG. 3A is a schematic plan view of the memory array of FIG. 2A after recessing the space holder.
Figure 3B:
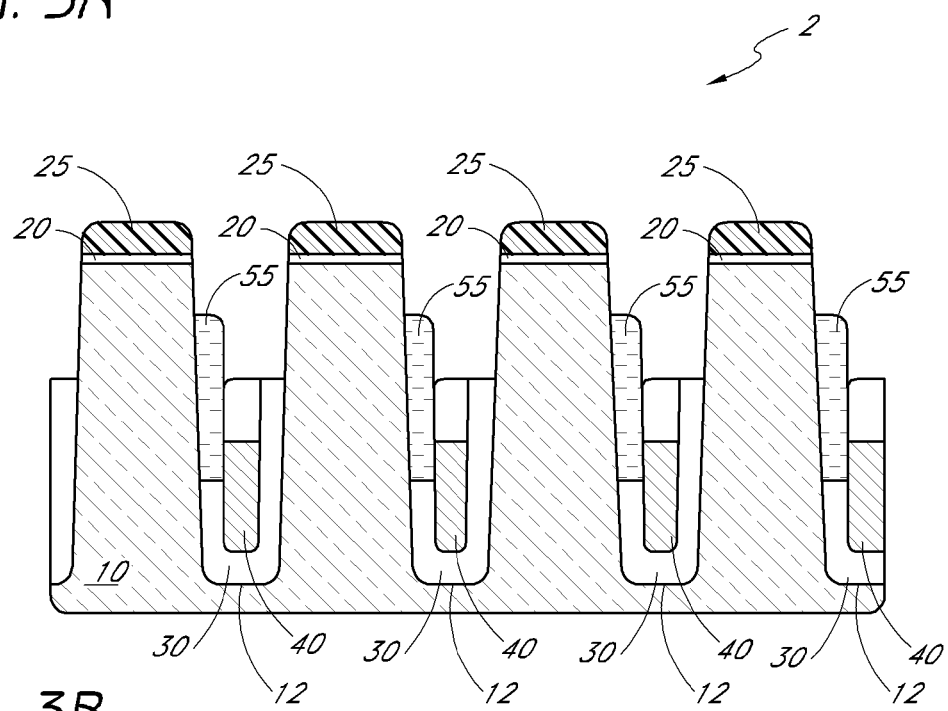
FIG. 3B is a schematic cross-section of the array of FIG. 3A along line 3B-3B of FIG. 3A.

FIGS. 3A and 3B illustrate etching the space holder 55 and recessing the trench oxide 30. Preferably, the space holder 55 is etched first in order to expose the STI oxide, but some of the space holder 55 is retained to protect the buried digit line 40 during the oxide etch. The depth of the trench oxide 30 recess process is determined with reference to the desired height of the silicon pillar that is to be formed in the substrate 10. The trench oxide 30 is preferably recessed to a height slightly higher than the desired pillar base level. For example, if the silicon pillar is approximately 2500 Å tall, the trench oxide 30 is etched approximately 2000 Å. Preferably, the trench insulator 30 is recessed down between about 1500 Å and 3000 Å from the level of the cap layer 25, more preferably down by between about 1750 Å and 2500 Å. Recessing oxide can be done by many etching processes, including wet and dry etch processes. Skilled practitioners will appreciate that many etch processes can be used to recess the trench oxide 30.

The space holder 55 is preferably removed by a selective plasma etch or wet etch process after recessing the trench oxide 30. A short wet clean is also performed in order to remove any silicon oxide formed on the exposed bulk silicon 10.

Figure 4A:
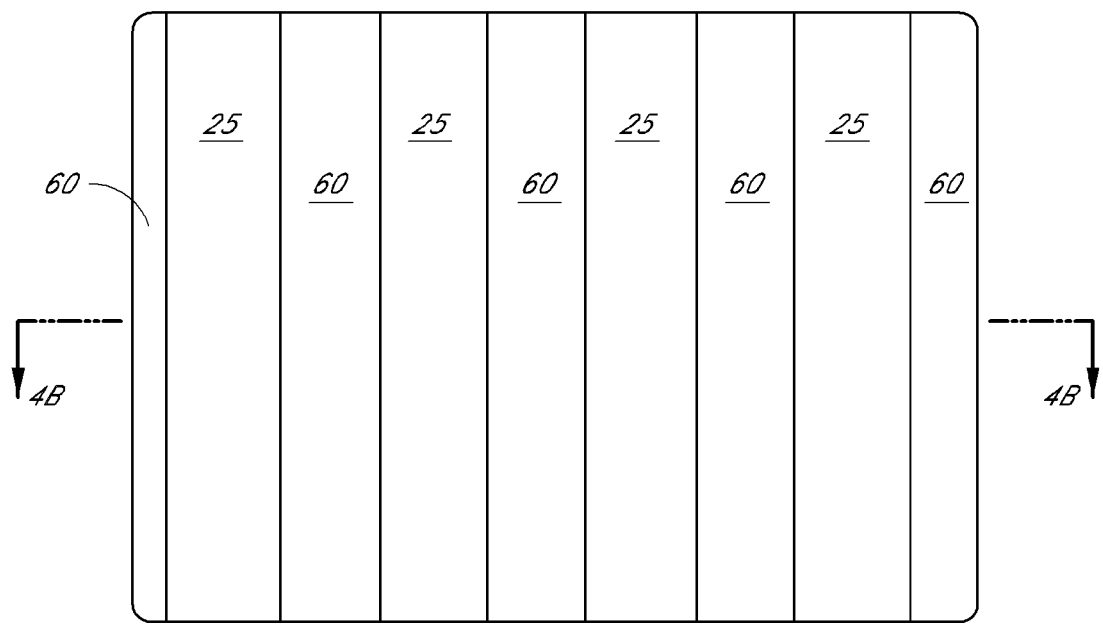
FIG. 4A is a schematic plan view of the memory array of FIG. 3A after deposition of a strap material.
Figure 4B:
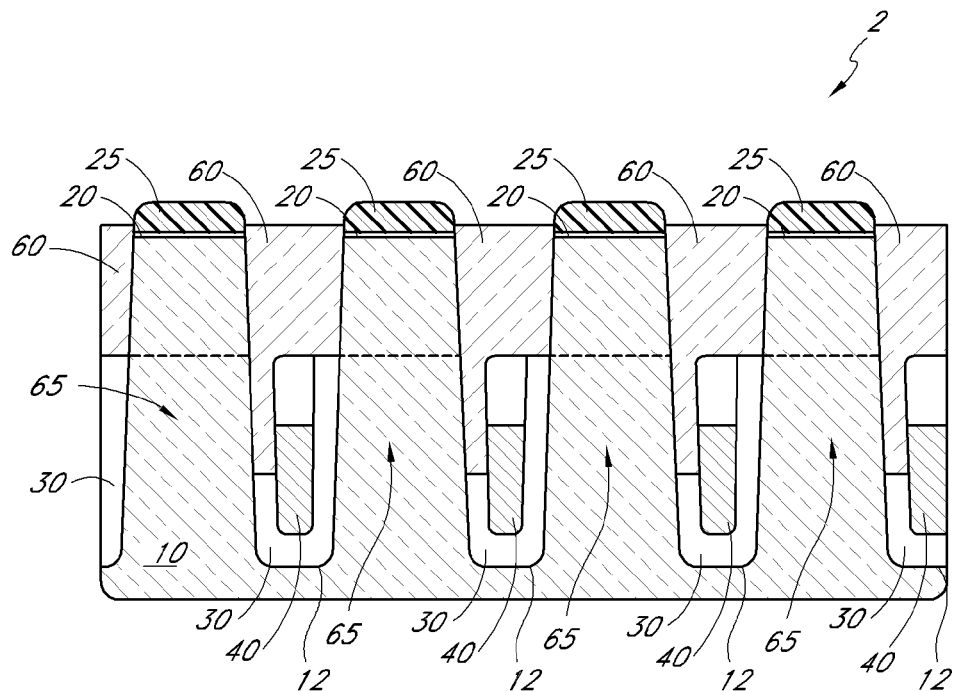
FIG. 4B is a schematic cross-section of the array of FIG. 4A along line 4B-4B of FIG. 4A.

FIGS. 4A and 4B illustrate the blanket deposition and etch back of a strap layer 60 that will form the strap that will connect the buried digit line 40 to the adjacent silicon regions 65 that will form the lower active areas. Preferably, the strap layer 60 is a polysilicon layer, more preferably a highly n-doped polysilicon layer. It is deposited over the trench oxide 30 and contacts the buried digit line 40 and a portion of the substrate 20 that will eventually form the lower active areas 65. By strapping the buried digit line 40 in the STI area to the lower active area 65, a separate interconnect for the buried digit line and the active area is not necessary. Fabrication time and costs are reduced by not having to fabricate the separate interconnect.

In one embodiment to form a dynamic random access memory (DRAM) device, circuitry in the periphery outside of the array 2 can be defined after depositing the strap layer 60. In this embodiment, a protective material, such as a TEOS oxide, is preferably formed over the array 2 during, e.g., CMOS fabrication in the periphery.

The cap layer 25 is preferably removed after forming the strap layer 60. Preferably, the cap layer 25 is removed in a selective wet etch process. Preferred etchants include phosphoric acid and derivatives of phosphoric acid. Skilled artisans will appreciate that there are several methods to remove silicon nitride selectively from a substrate. Additionally, the pad oxide 20 can also be removed.

Figure 5A:
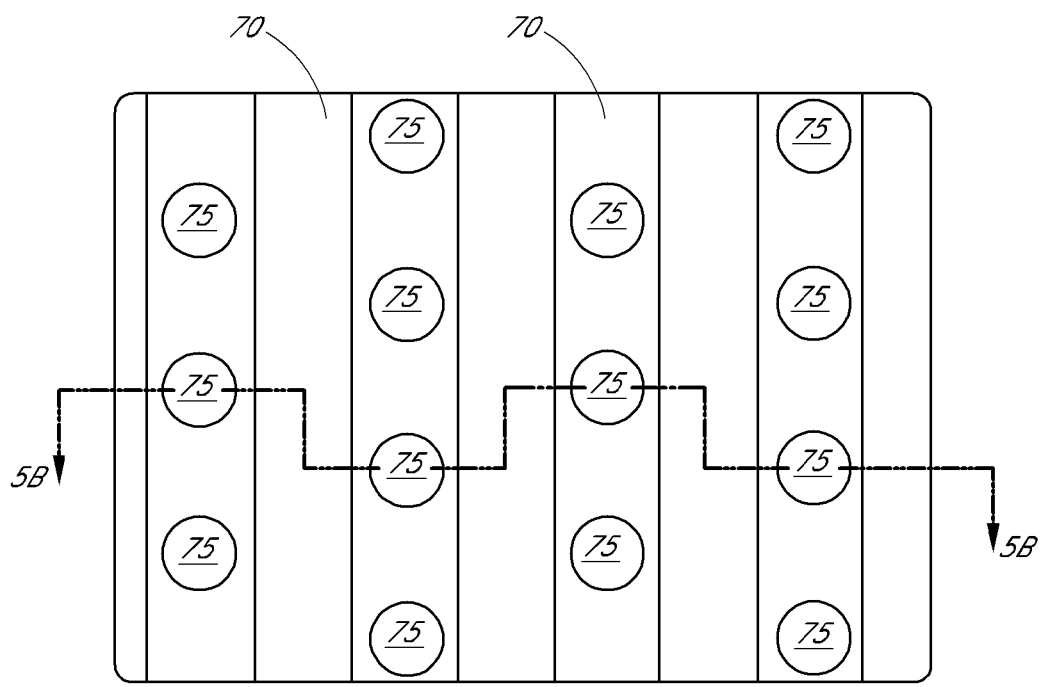
FIG. 5A is a schematic plan view of the memory array of FIG. 4A after removing a cap over substrate ridges and patterning a masking layer.
Figure 5B:
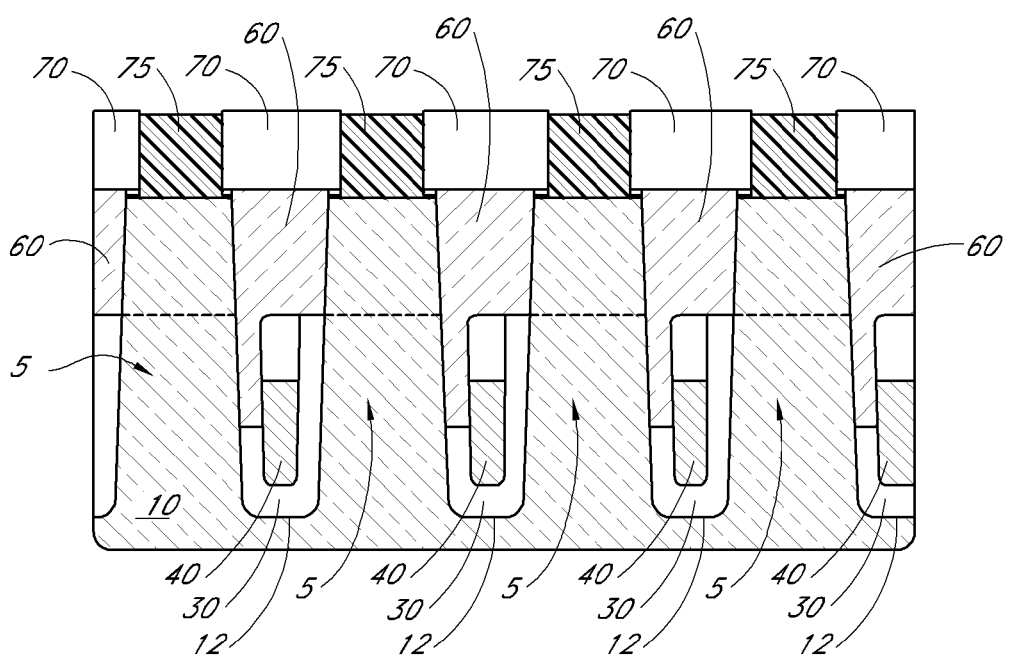
FIG. 5B is a schematic cross-section of the array of FIG. 5A along line 5B-5B of FIG. 5A.

In FIGS. 5A and 5B, a structural layer 70, preferably an oxide layer, has been deposited over the array. Preferably, the structural layer 70 is a TEOS oxide with a thickness of between about 600 Å and 1100 Å, more preferably between about 650 Å and 1000 Å. A plurality of holes is formed within the structural layer 70. The holes expose portions of the substrate 10 that will eventually form the transistor pillars. The holes are filled with another mask material 75 and planarized back to the structural layer 70. Preferably the holes pattern is formed using standard lithography and etch techniques, such as an anisotropic etch step. In the illustrated embodiment, the holes are formed in a staggered fashion in order to increase the density of memory cells.

A deep implant, preferably a p+ implant, can be performed after the holes in the structural layer 70 are etched to expose a pillar region of the substrate 10 and before filling with the mask material 75. The implant preferably reaches the base of the substrate, which is preferably a p-doped well. This reduces the floating body effect in the silicon pillars. The floating body effect occurs when the active region is isolated from the substrate by a lower source/drain region and the adjacent space charge region. This causes the floating transistor body to charge up and subsequently the discharge of the cell capacitor. By performing the implant step, the depletion zones can be limited to the edges of the active areas and should not meet.

As noted, the holes in the structural layer 70 are filled with a protective mask material 75, which is preferably silicon nitride. Any excess protective material 75 is removed by a blanket nitride etch over the structural layer 70. The structural layer 70 is sacrificial, so selectivity of the blanket nitride etch is relatively unimportant.

Figure 6A:
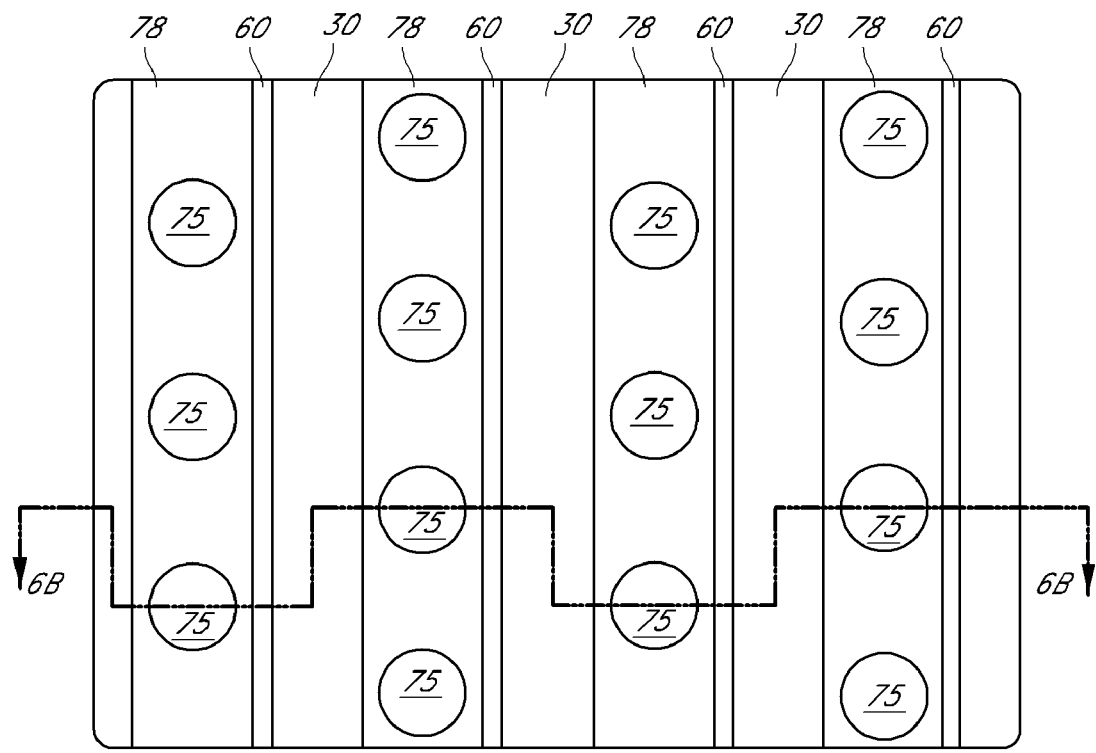
FIG. 6A is a schematic plan view of the memory array of FIG. 5A after an etch step.
Figure 6B:
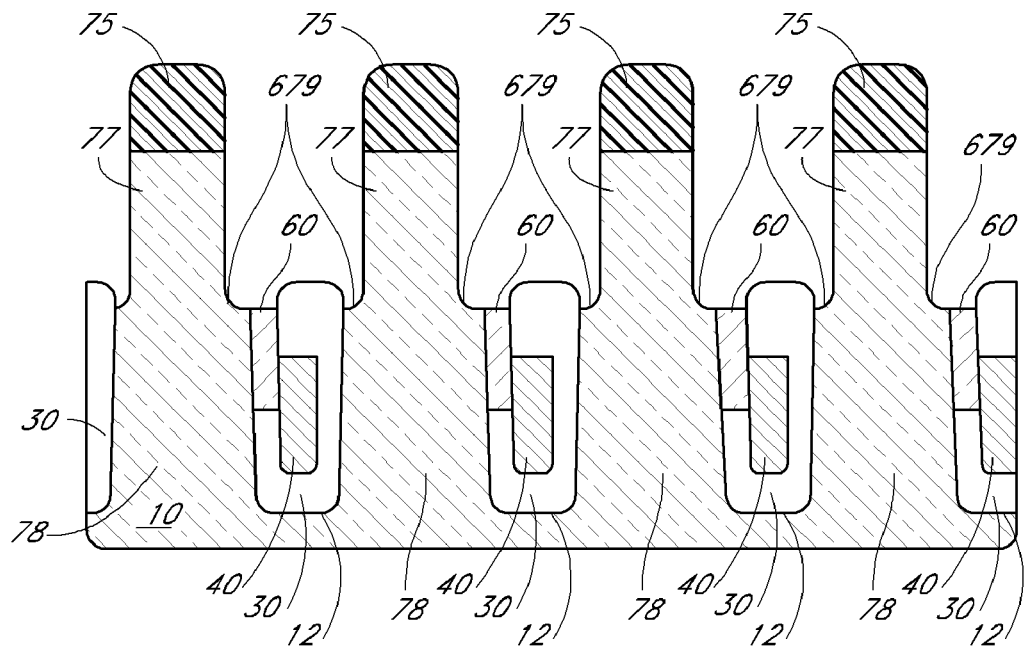
FIG. 6B is a schematic cross-section of the array of FIG. 6A along line 6B-6B of FIG. 6A.

In FIGS. 6A and 6B, the structural layer 70 is removed and the protective material 75 is used to mask the substrate 10 to form a plurality of pillars 77. By etching the pillars out of the substrate, a substrate ridge 78 is formed between the trenches 12 that extends from the bottom level of the trenches 12 to the bottom level of the pillars 77. The ridges 78 are preferably wider than the pillars 77 so the ridges have rounded shoulders 679. Preferably, an in situ selective oxide etch is used to remove the TEOS oxide of the structural layer 70. The protective mask 75 can then be used as a mask during a selective silicon etch to form vertical silicon pillars 77 by recessing the strap material 60 and etching exposed bulk silicon from the substrate 10. The height of the pillars 77 is preferably determined by the height of the gate and the elevation for the cell capacitor contact. Preferably, the height of the pillars 77 from the upper surface or shoulder portions 679 of the ridge 78 is between about 1000 Å and 2000 Å, more preferably between about 1400 Å and 1800 Å. In a preferred embodiment, the straps 60 are even with the shoulders 679 of the ridges 78.

Figure 7A:
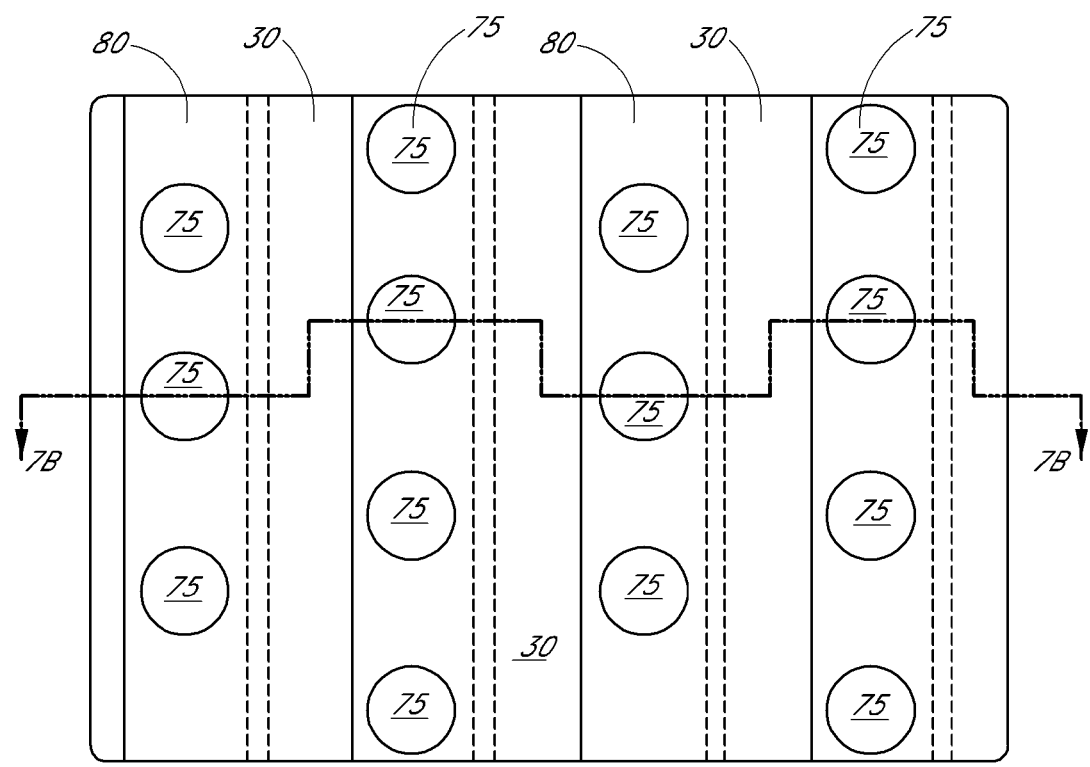
FIG. 7A is a schematic plan view of the memory array of FIG. 6A after a spacer formation and an oxidation process.
Figure 7B:
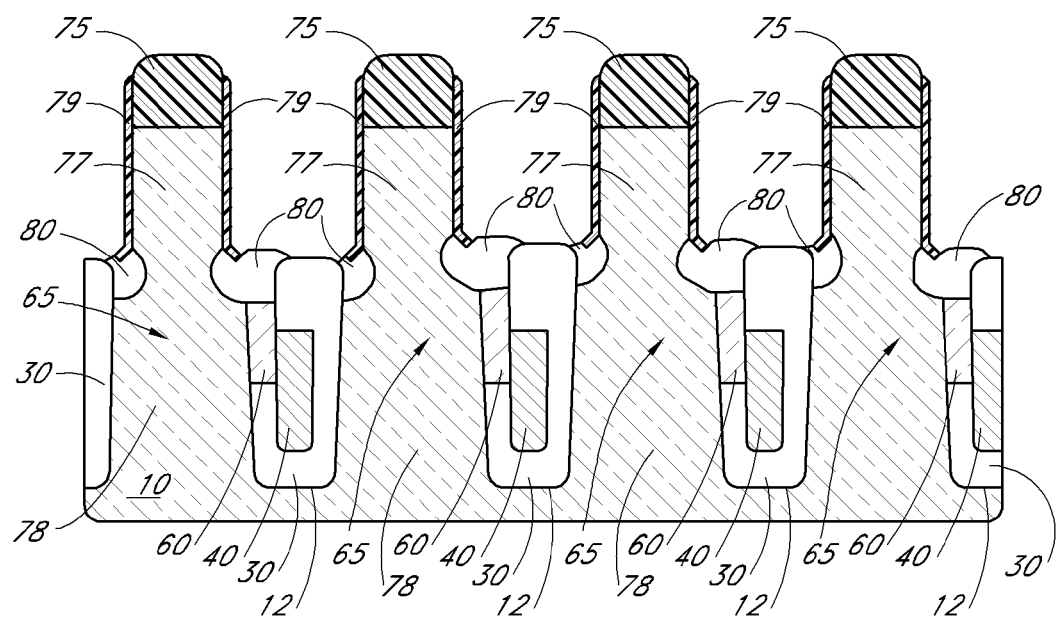
FIG. 7B is a schematic cross-section of the array of FIG. 7A along line 7B-7B of FIG. 7A.

In FIGS. 7A and 7B, a nitride liner 79 has been deposited over the array 2. The nitride liner 79 preferably has a thickness of between 40 Å and 100 Å, more preferably 50 Å and 80 Å. A punch-through etch is performed to remove the nitride liner 79 from the strap 60, the trench oxide 30, and the base of the pillars 77. The top surface of the substrate ridges 78 and the strap 60 are then thermally oxidized in order to isolate the strap 60, the pillars 77 and the ridges 78 from a word line that will subsequently be deposited. Thermal oxidation of the exposed silicon forms an isolation layer 80 with a thickness of between about 300 Å and 500 Å, more preferably between about 350 Å and 450 Å. In a preferred embodiment, during the thermal oxidation, the n-dopants of the poly strap 60 diffuse into the substrate 10 to form the lower active areas 65.

A selective nitride strip or etch is preferably preformed to expose the sides of the pillars 77 by removing the spacers 79. Because the spacers 79 are thin, only a small portion of the nitride cap 75 may also be removed during the nitride strip. The nitride strip or another separate oxide etch process preferably removes a portion of the insulation layer 80. After this step, the insulation layer 80 preferably has a thickness of between about 175 Å and 325 Å, more preferably between about 200 Å and 300 Å.

Figure 8A:
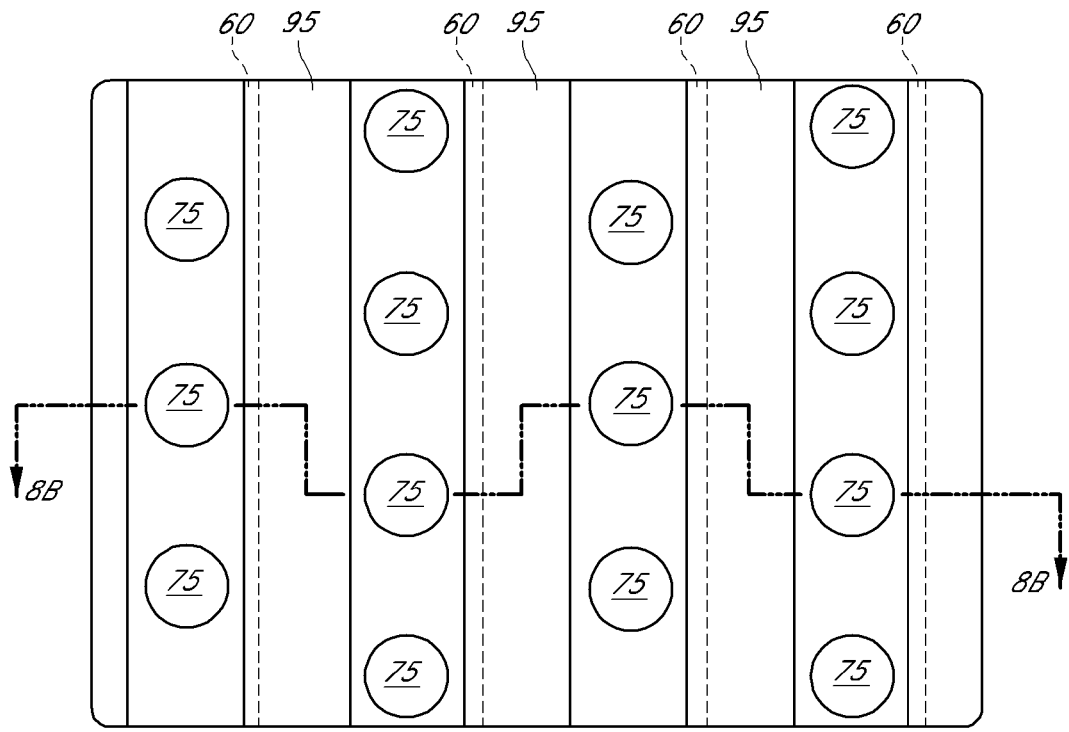
FIG. 8A is a schematic plan view of the memory array of FIG. 7A after stripping spacers, forming a gate dielectric, and depositing a word line material.
Figure 8B:
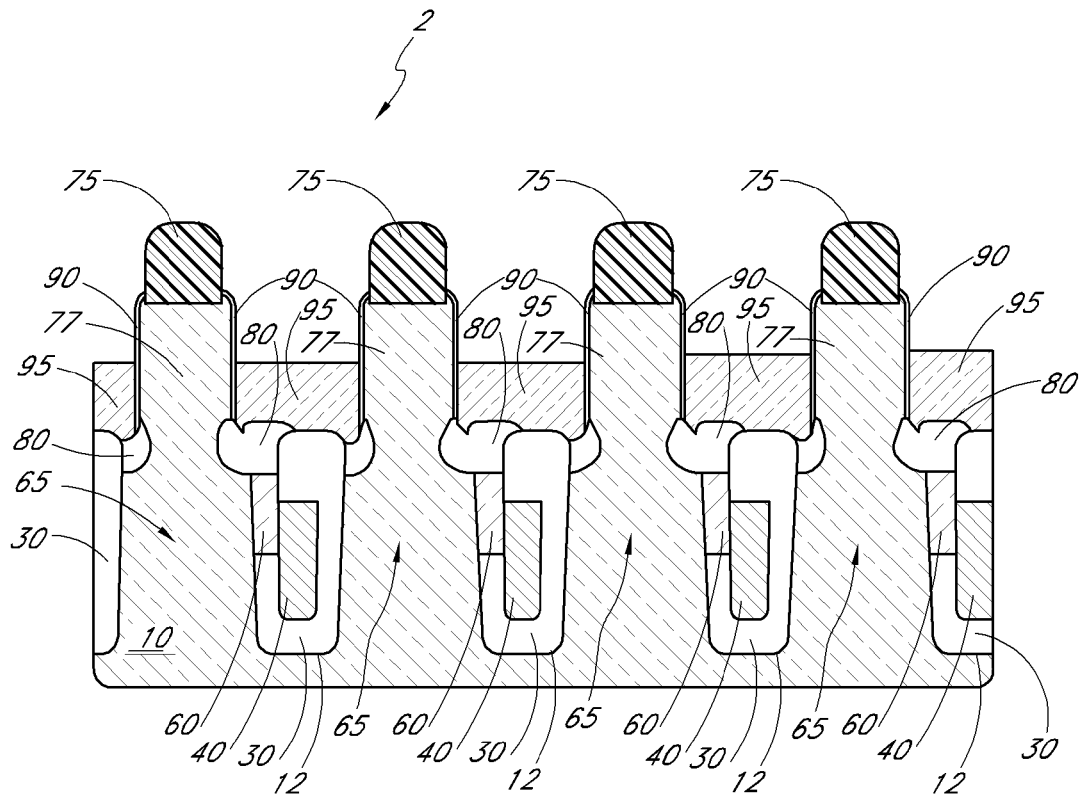
FIG. 8B is a schematic cross-section of the array of FIG. 8A along line 8B-8B of FIG. 8A.

Referring now to FIGS. 8A and 8B, a gate dielectric 90 is formed upon the pillars 77 after the nitride 79 is stripped. A thin thermally grown silicon oxide layer can serve as the gate dielectric 90. The gate dielectric 90 can also be deposited.

Once the gate dielectric 90 has been formed, a word line material 95 is blanket deposited and etched back. The word line 95 material, preferably polysilicon, is deposited over the entire array 2 and recessed to reduce the thickness. Preferably the thickness of the word line 95 is between about 500 Å and 2000 Å, more preferably between about 1000 Å and 1500 Å. The remaining thickness of the polysilicon used for the word line 95 will determine the length (or more accurately described, the height) of the vertical surround gate adjacent a channel region defined in the pillar 77.

Figure 9A:
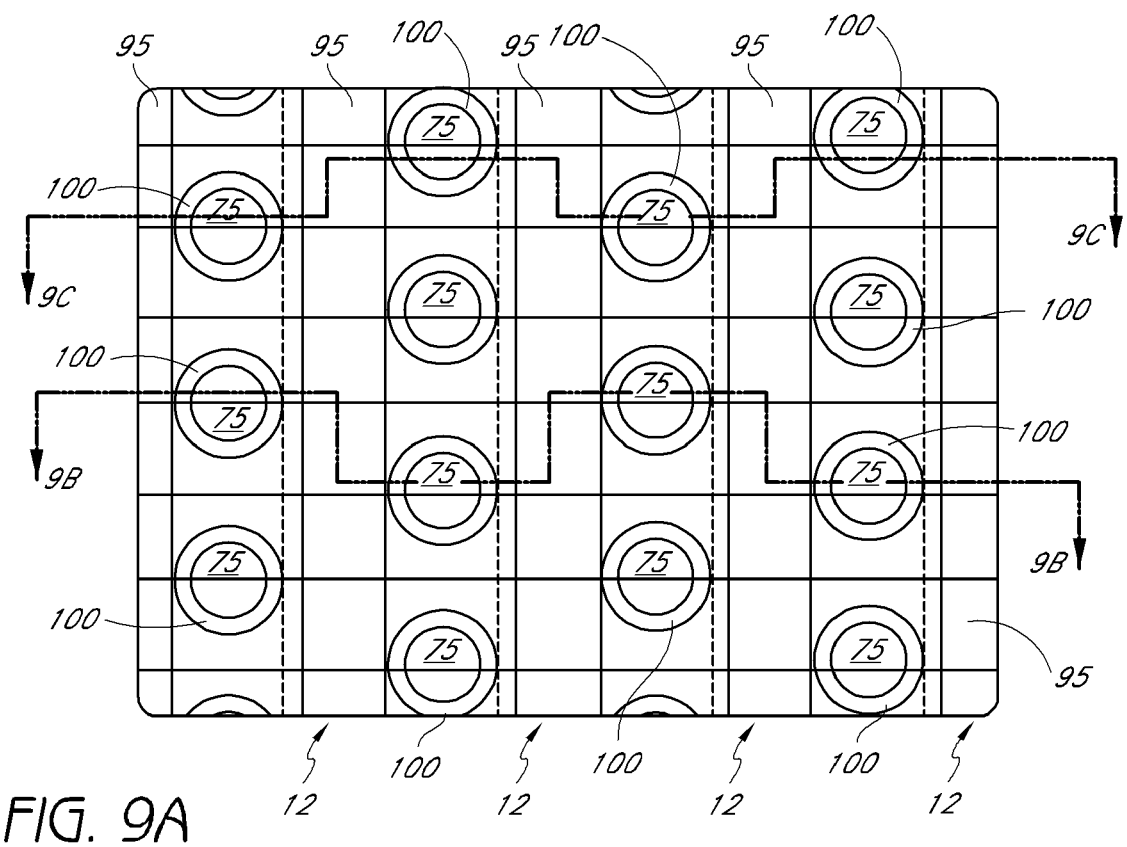
FIG. 9A is a schematic plan view of the memory array of FIG. 8A after forming self-alignment spacers and patterning word lines.
Figure 9B:
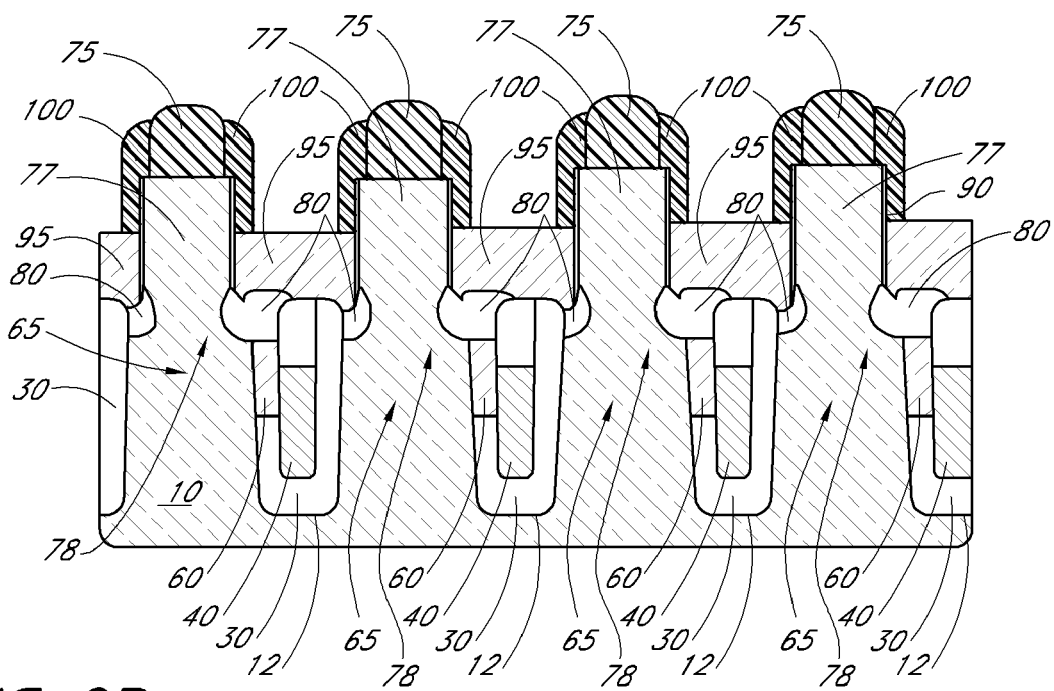
FIG. 9B is a schematic cross-section of the array of FIG. 9A along line 9B-9B of FIG. 9A.
Figure 9C:
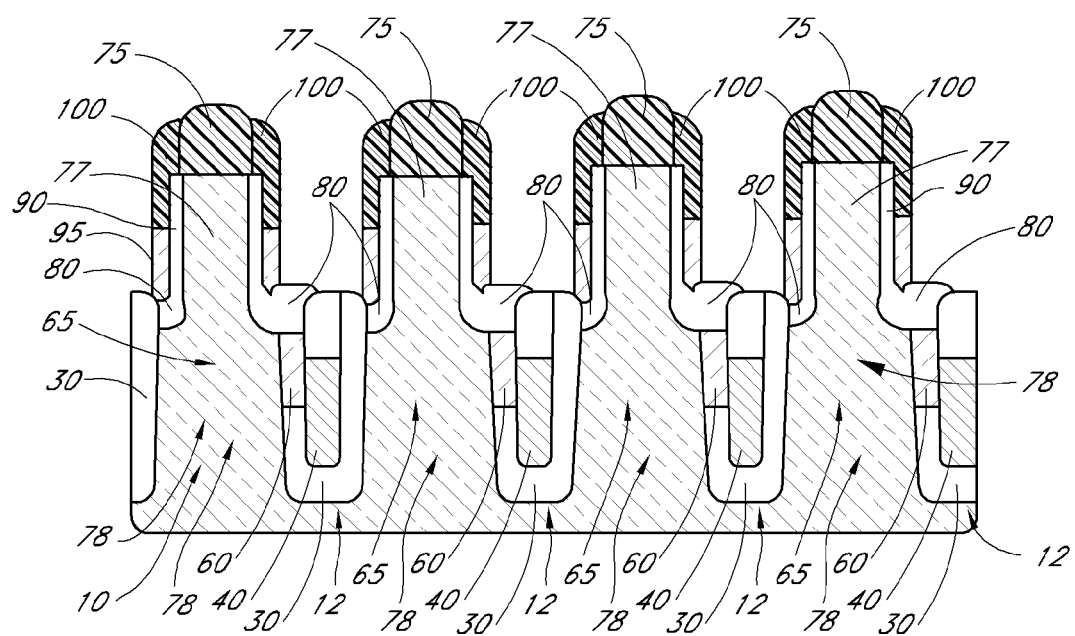
FIG. 9C is a schematic cross-section of the array of FIG. 9A along line 9C-9C of FIG. 9A

In FIGS. 9A-9C, spacers 100 have been formed around the pillars 77. A nitride layer is preferably blanket deposited over the whole array and then anisotropically etched, preferably by a dry plasma etch. The etch preferably stops on the poly of the word line 95 to form spacers 100 around the vertical sidewalls of the pillars 77. By using the spacers 100, word line material surrounding the entire pillar 77 is masked and will not be removed once the word line material 95 is etched to form distinct word lines, as best seen from FIG. 9C. This will perform the function of self-aligning the word line 95 to the transistor pillars 77, ensuring that the gate surrounds the transistor pillar 77. As long as the conductive line forming the word line across each row overlaps the region encompassed by the spacer 100, conductive contact to a vertical surround gate results and the mask described below need not be precisely aligned. This self-aligned feature also enables the illustrated dense staggered configuration connected by a grid of word lines and bit lines.

A mask, preferably a soft resist mask, is formed over the word line material 95. The word line 95 is then etched according to the mask to form distinct word lines 95 within the array 2. The etch process preferably stops on oxide, so as to stop the etch process upon hitting the trench oxide 40 or the insulation layer 80. The word lines 95 connect neighboring memory cells in order to help form a memory array 2.

Figure 10A:
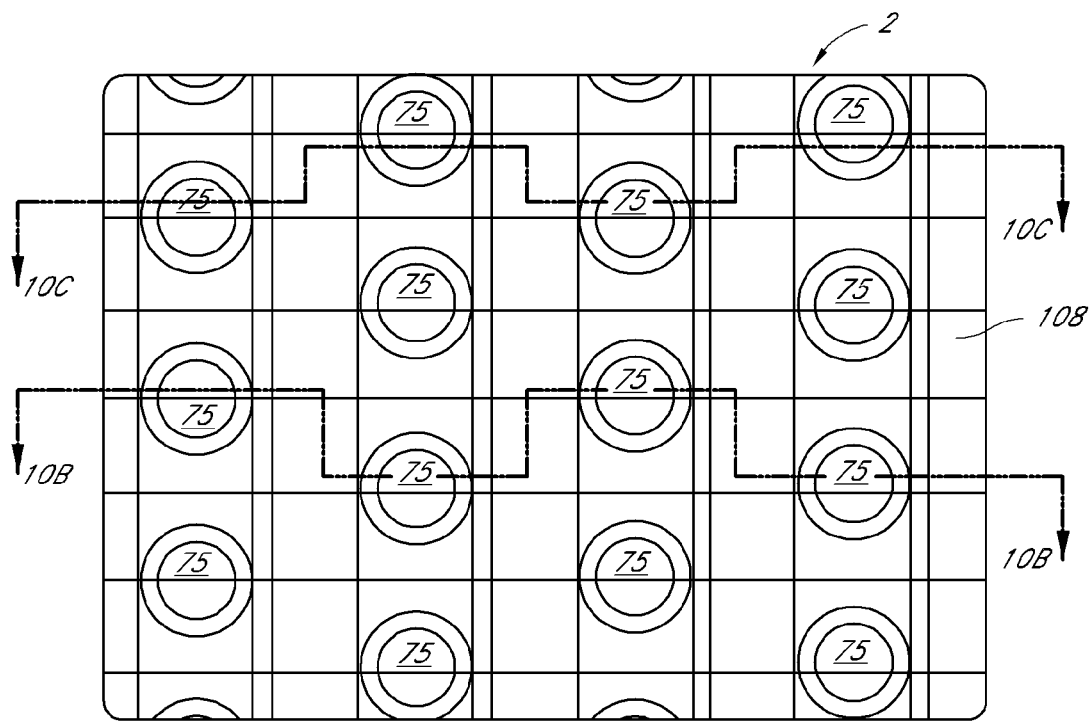
FIG. 10A is a schematic plan view of the memory array of FIG. 9A after depositing and planarizing an insulation layer.
Figure 10B:
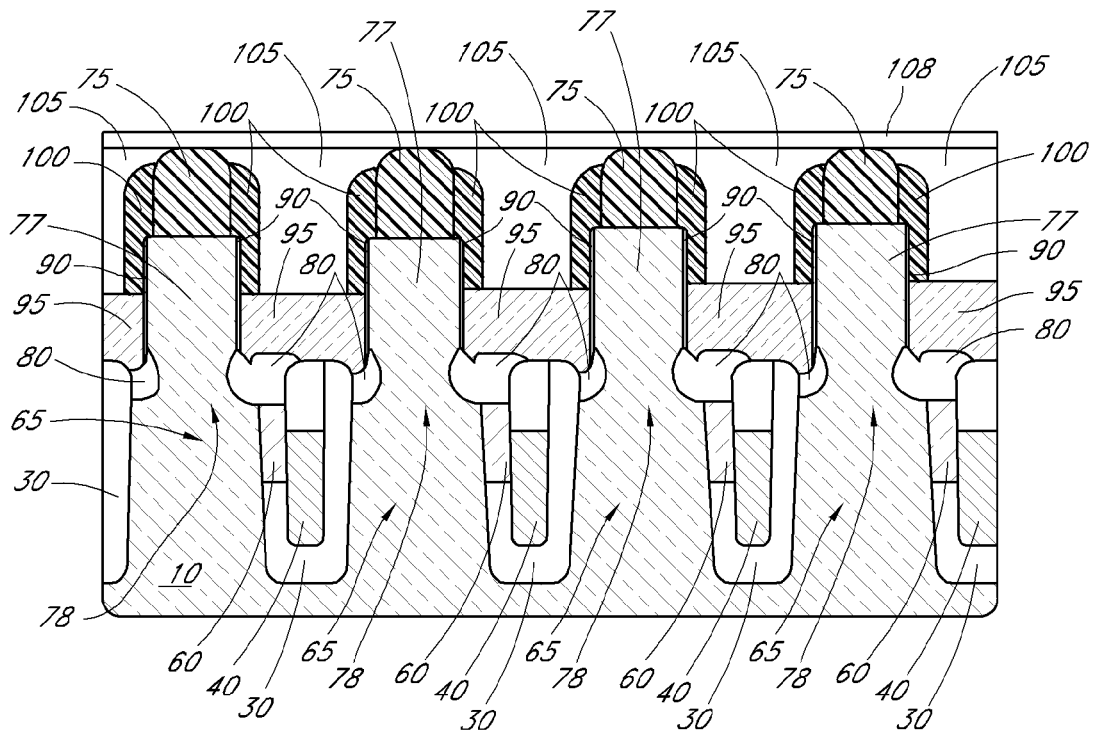
FIG. 10B is a schematic cross-section of the array of FIG. 10A along line 10B-10B of FIG. 10A.
Figure 10C:
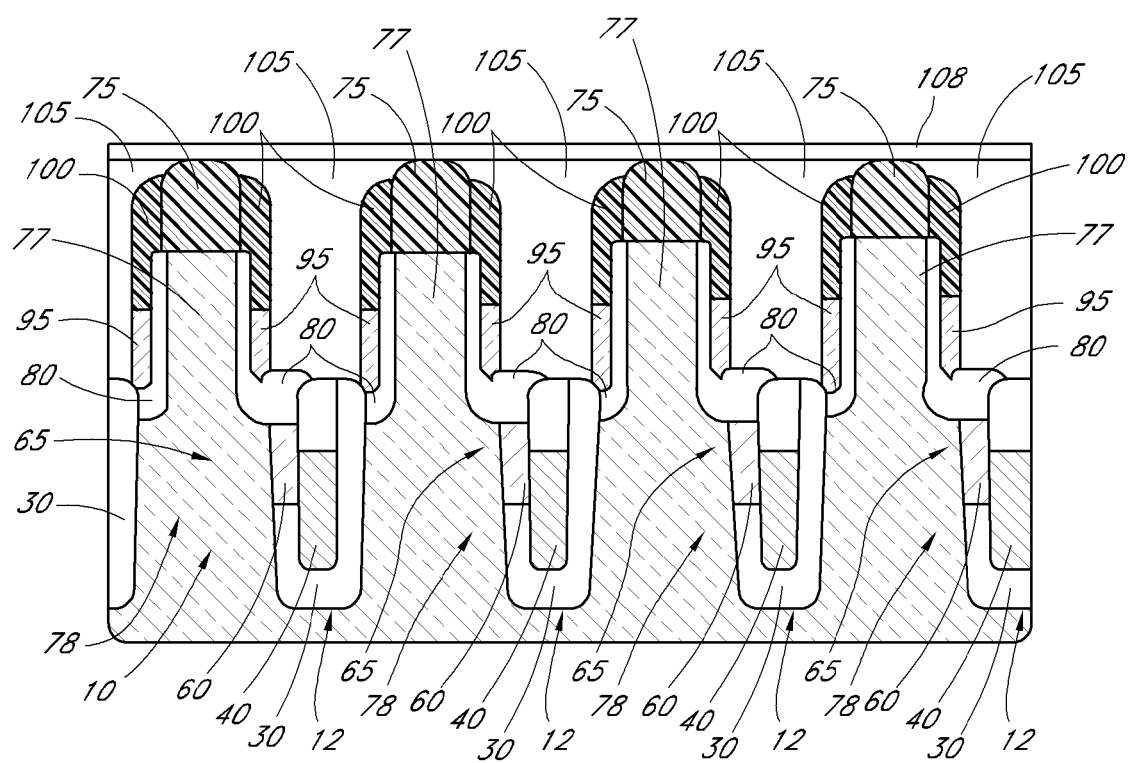
FIG. 10C is a schematic cross-section of the array of FIG. 10A along line 10C-10C of FIG. 10A

In FIGS. 10A-10C, an insulator layer 105 has been deposited over the array 2. Preferably, a CMP step is then performed on the insulator 105 to planarize the surface over the array. A blanket layer of an etch stop layer 108, such as silicon nitride, is deposited over the array 2.

With reference to FIG. 11, the caps 75 over the pillars 77 are removed in order to provide a contact for a bottom capacitor electrode 110. Once the caps 75 are removed, the top of the transistor pillars 77 can be doped to form an upper active area 103 that serves as the drain of the vertical transistor.

FIG. 11 further illustrates the formation of bottom electrodes 110 for cell capacitors over the upper active area 103 of the pillar 77. In another embodiment, a capacitor contact plug can be used between the bottom electrode 110 and the upper active area 103. Preferably the bottom electrode 110 is a container electrode. Preferred materials for the bottom electrode 110 include polysilicon, tungsten, and titanium nitride. There are several methods of forming cell capacitors. Preferably, a lower electrode is formed within a structural layer that is later removed. One preferred method for forming a bottom electrode is described in U.S. Pat. No. 6,756,627, issued to Wu, et al., which is incorporated by reference herein. In that application, a bottom container capacitor electrode is formed over a transistor using a separate contact. However, many methods of making a container capacitor are available. Once the bottom electrodes 110 are formed, a capacitor dielectric and an upper electrode are formed over the bottom electrode to complete the formation of the cell capacitors. In a preferred embodiment, the upper electrode is a common electrode to the array. Preferred upper electrode materials include tungsten, titanium nitride, metals and metal alloys. The capacitor dielectric can also be common to the array. Preferred materials for the capacitor dielectric include tantalum oxide, hafnium oxide, and other metal oxides. Other methods of forming a capacitor can also be used to form the cell capacitor.

Structure of Transistors using a Digit Line Strap

The structure of several memory cells of the memory array can be seen in FIG. 11. Buried digit lines 40 are formed within isolation trenches 12 and buried or isolated by a trench insulator 30. A strap 60 running along the digit line 40 and also within the isolation trench 12 connects the digit line 40 to the lower active area 65 within the substrate ridge 78. Preferably, the strap 60 is recessed within the isolation trench 12 and so does not risk shorting to the word line 95. The lower active areas 65 are preferably in a substrate ridge 78 in the substrate 10 below transistor pillars 77. The insulation layer 80 over the strap 60 isolates the strap 60 from the word line 95, which surrounds a row of transistor pillars 77. Preferably, the transistor pillars 77 are formed from material of the substrate 10 that has been masked to form the pillars 77, thus leaving a superior crystalline quality relative to epitaxial silicon.

In preferred embodiments, an insulator 105 and an etch stop layer 108 also overlie the word line 95. A cell capacitor is formed with a bottom electrode 110 over and electrically connected to the transistor pillar 77. In the illustrated embodiment in FIG. 11, the bottom electrodes are directly connected to the transistor pillars, but a conductive plug or other connection device could be used to electrically connect each bottom electrode to its respective transistor pillar 77. The cells are completed by forming capacitor dielectrics and upper electrodes over the bottom electrode 110.

Skilled practitioners will appreciate that additional processing steps may be used to complete the formation of a memory device using the disclosed memory cells. For example, control circuitry can be formed in the periphery and the memory cells can be further isolated. It should also be appreciated that adjacent memory cells can share elements, such as a source/drain region.

Stitching the Buried Digit Line to the Active Area

Figure 12A:
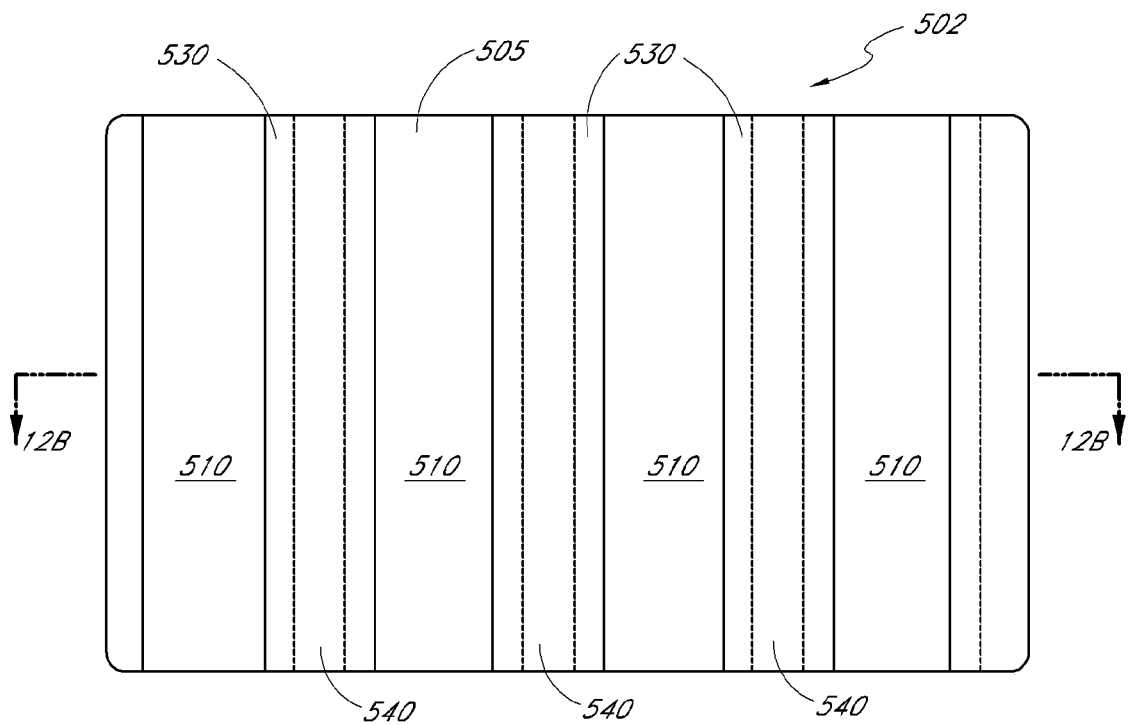
FIG. 12A is a schematic plan view of a partially fabricated memory array in another preferred embodiment, showing a pattern of buried digit lines in parallel trenches.
Figure 12B:
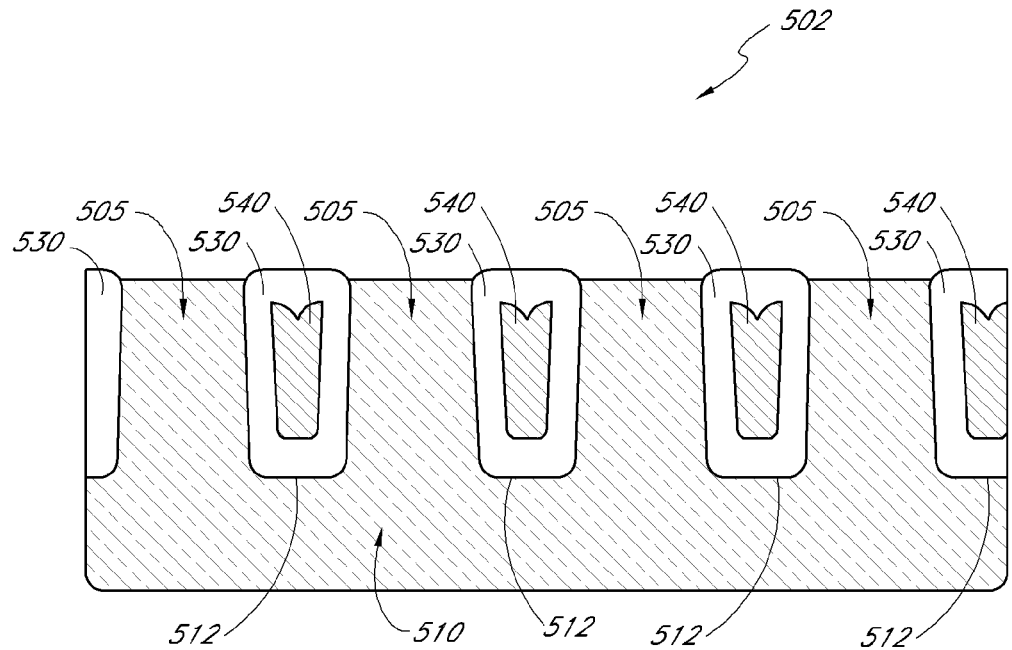
FIG. 12B is a schematic cross-section of the array of FIG. 12A along line 12B-12B of FIG. 12A.

In another preferred embodiment, the connection between the active area and the buried digit line is isolated to a series of isolated stitches, instead of a strap running the length of the buried digit line. The process begins in a similar fashion to the embodiment above. A buried digit line is formed within a trench lined with an insulation layer. FIG. 12A is a surface view of the array 502. The buried digit line 540 is shown in FIG. 12B within an insulating layer 530 between ridges 505. Nitride caps are preferably used over the ridges 505 during the deposition of the buried digit line 540, but have been removed prior to the stage of FIG. 12B. Preferably the nitride caps are removed by a wet nitride strip. The ridges 505 are preferably capped during formation of the buried digit line 540 with a nitride layer, but the nitride layer is preferably removed after the remainder of trenches have been filled with an oxide.

Figure 13A:
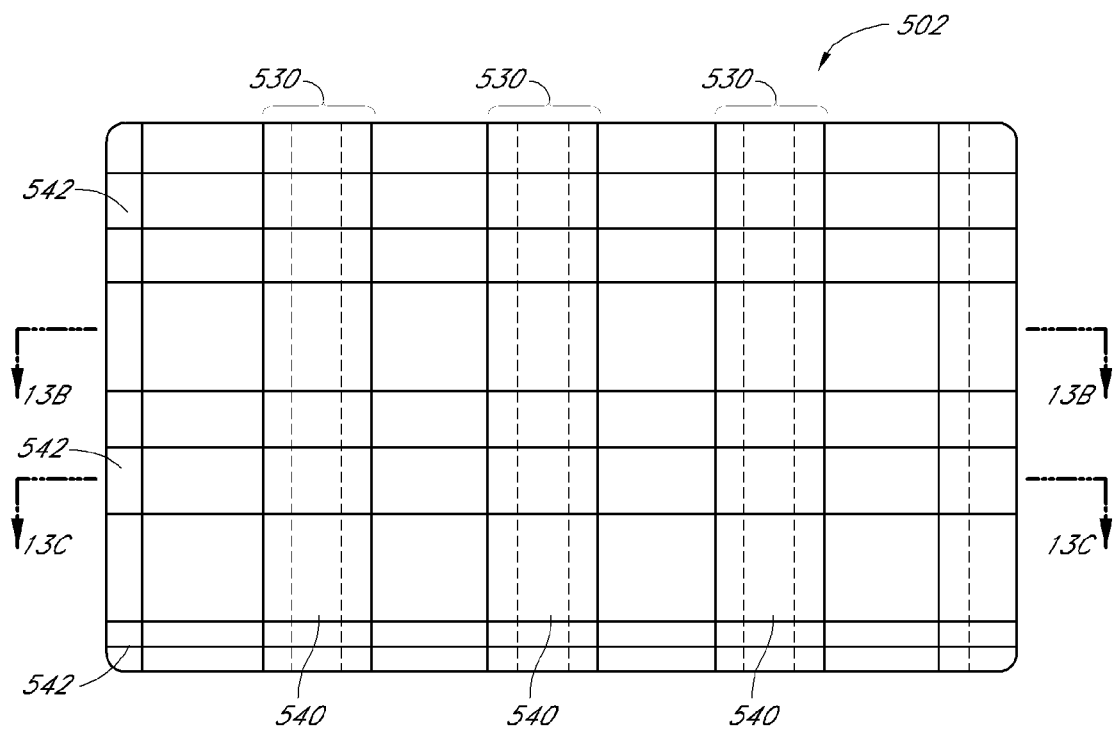
FIGS. 13A-13C schematically illustrate the memory array of FIG. 12A after depositing and patterning a first mask of lines crossing the digit line trenches.
Figure 13B:
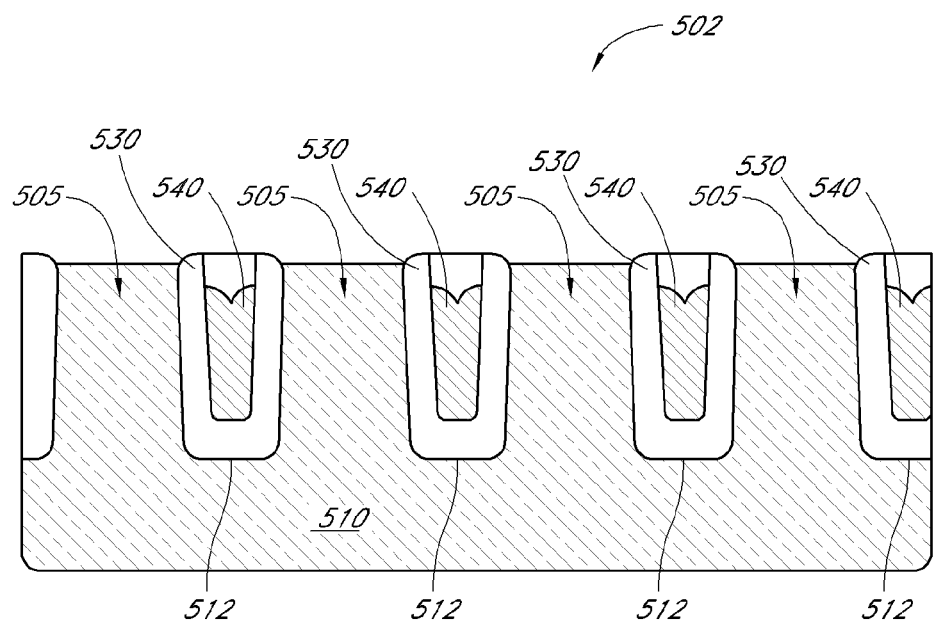
Figure 13C:
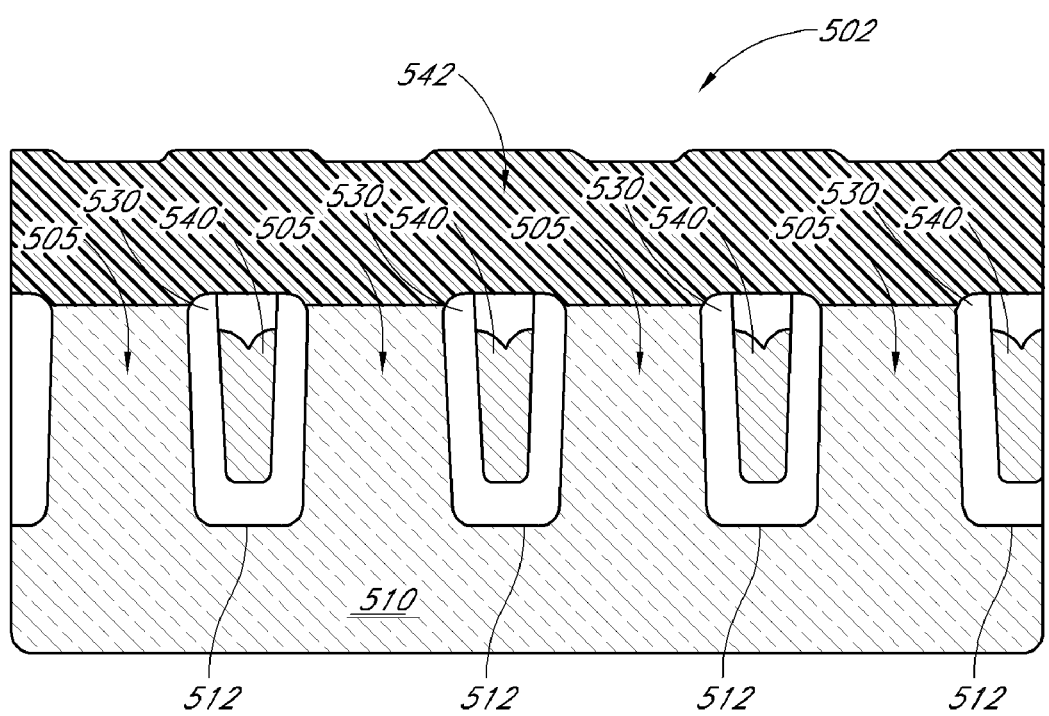

In FIGS. 13A-13C, a first mask material, preferably nitride, is deposited over the array 502. This is best illustrated in FIG. 13C. Preferably, the first mask layer has a thickness of between about 2000 Å and 3000 Å, more preferably between about 2250 Å and 2750 Å. The first mask material is patterned to form a series of mask lines 542. The mask lines 542 serve as a mask for subsequent processing.

Figure 14A:
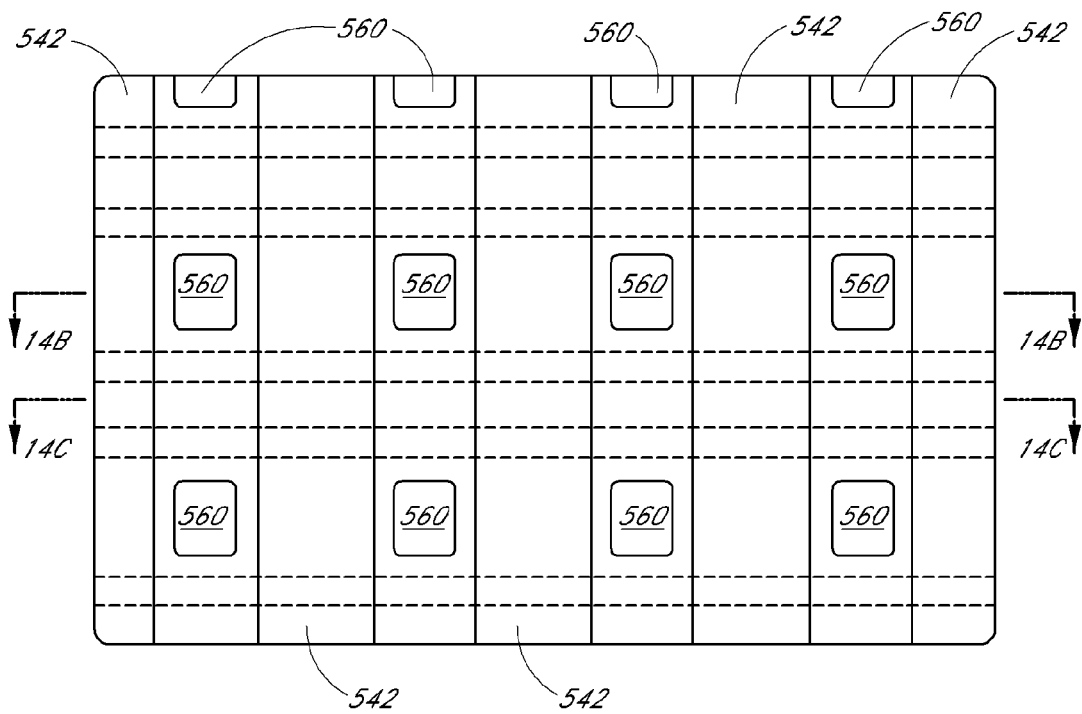
FIGS. 14A-14C schematically illustrate the memory array of FIG. 13A rotated 90 degrees after forming a second mask to form exposed substrate windows, depositing a spacer in the exposed substrate windows and forming pillars epitaxially.
Figure 14B:
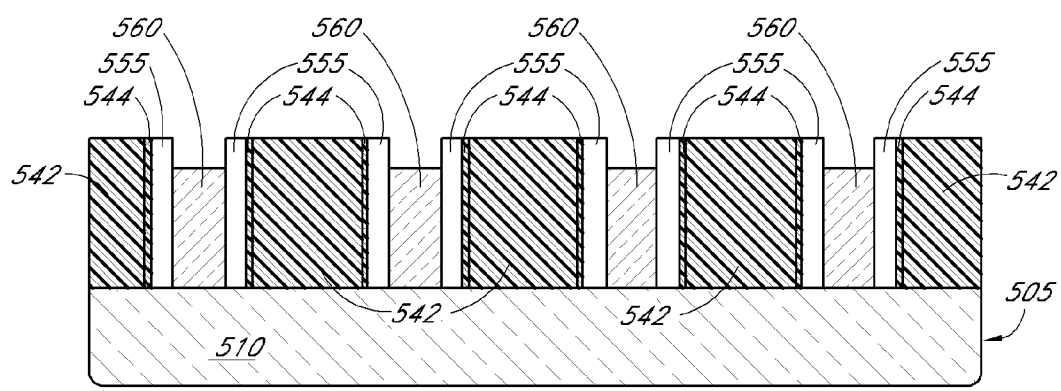
Figure 14C:
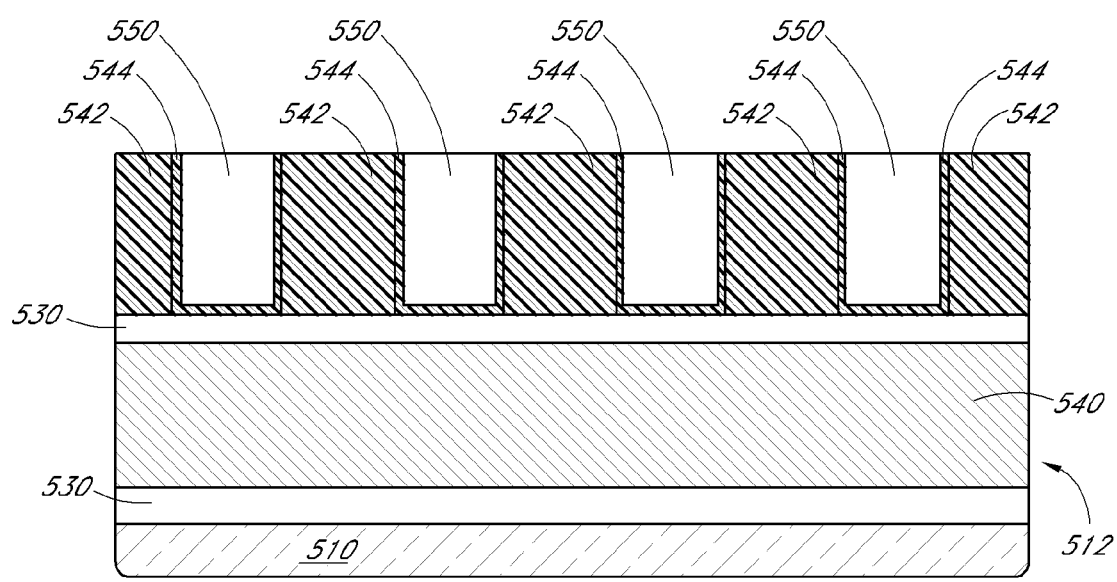

Referring now to FIGS. 14A-14C, a liner 544, preferably nitride, is formed to line the gaps between the mask lines 544. FIG. 14A has been rotated 90 degrees from the position of FIG. 13A, and the views of FIGS. 14B and 14C are parallel to the bit lines 540. The liner 544 is preferably thin, having a thickness of between about 30 Å and 80 Å. A second mask material 550 that can be etched selectively to the first mask material 542 is deposited between the first mask lines 542. Preferably, the second mask material 550 forms lines an oxide, more preferably a spin-on oxide. The second mask material 550 is over the region 505 that will include the active area in the final structure. A CMP step can be performed to planarize the surface after deposition of the second mask material 542. The CMP step preferably stops on the nitride liner 544.

The second mask layer 550 is patterned and etched after the CMP step. Preferably, a photoresist soft mask is formed over the second mask material 550, and can be formed in a pattern of lines crossing perpendicular to the lines of first mask material 542 and second mask material 550. The second mask material 550 is then etched selectively against the first mask material 542 to the substrate 510. This pattern forms windows or holes 552 to the substrate where the VSG channel will be formed. Preferably, the etch process is a selective oxide etch that will not substantially etch the first mask layer 542.

A spacer material 555, preferably TEOS oxide, is deposited within the holes 552 formed by the patterning of the second mask material 542. The spacer material preferably has a thickness of between 250 and 600 Å, more preferably between 300 Å and 500 Å. A spacer etch is performed on the array to remove excess spacer material and to clean the exposed active area for a subsequent selective epitaxial growth (SEG) step that will form the VSG channel 560. The spacers 555 effectively narrow the windows or holes 552.

The pillar 560 is preferably formed by selective epitaxial growth (SEG) within the narrowed windows or holes over the ridges 505. The epitaxial silicon is preferably grown to a desired height, but a silicon etch step can be performed to remove excess epitaxial silicon. Preferably the pillar 560 has a height of between about 1000 Å and 2000 Å, more preferably between about 1400 Å and 1800 Å.

Figure 15A:
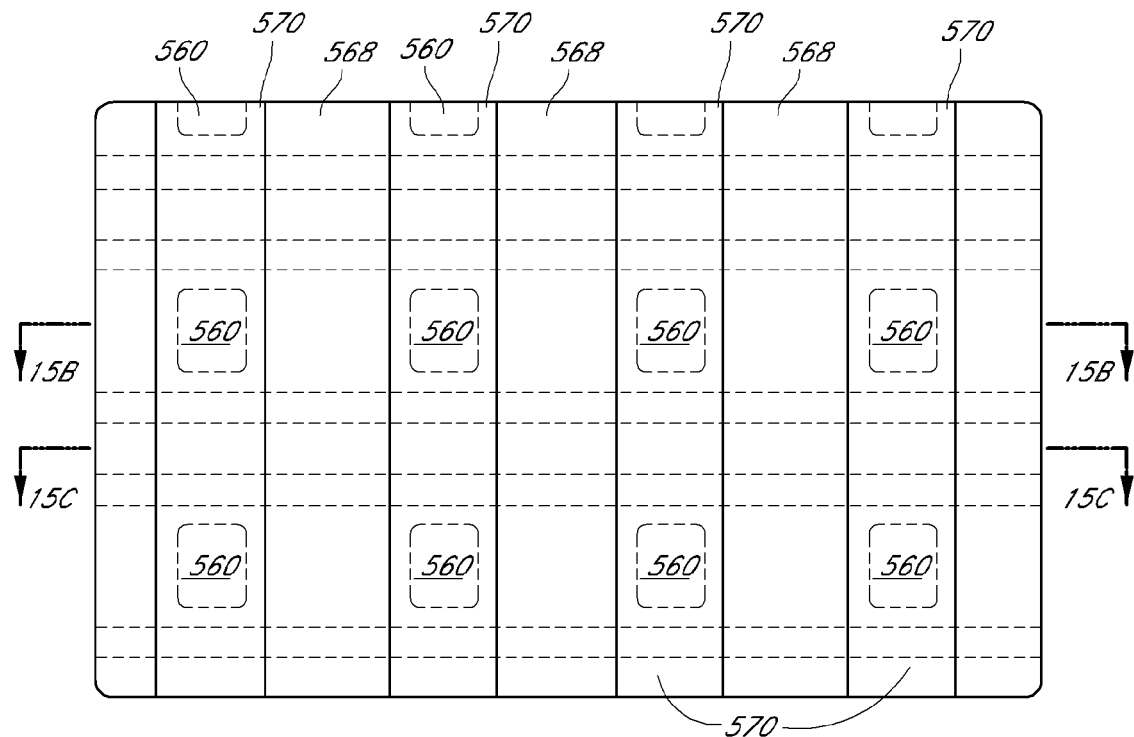
FIGS. 15A-15C schematically illustrate the memory array of FIG. 14A after forming word lines, an insulating layer, and a sacrificial mask.
Figure 15B:
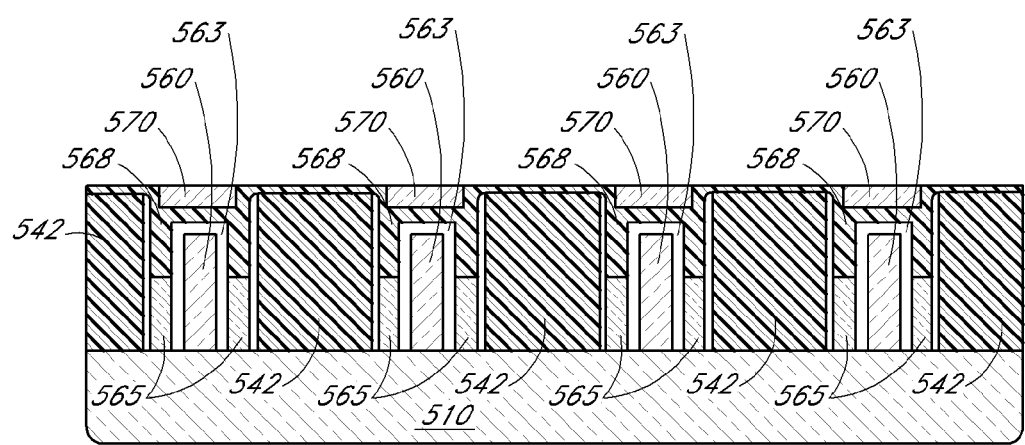
Figure 15C:
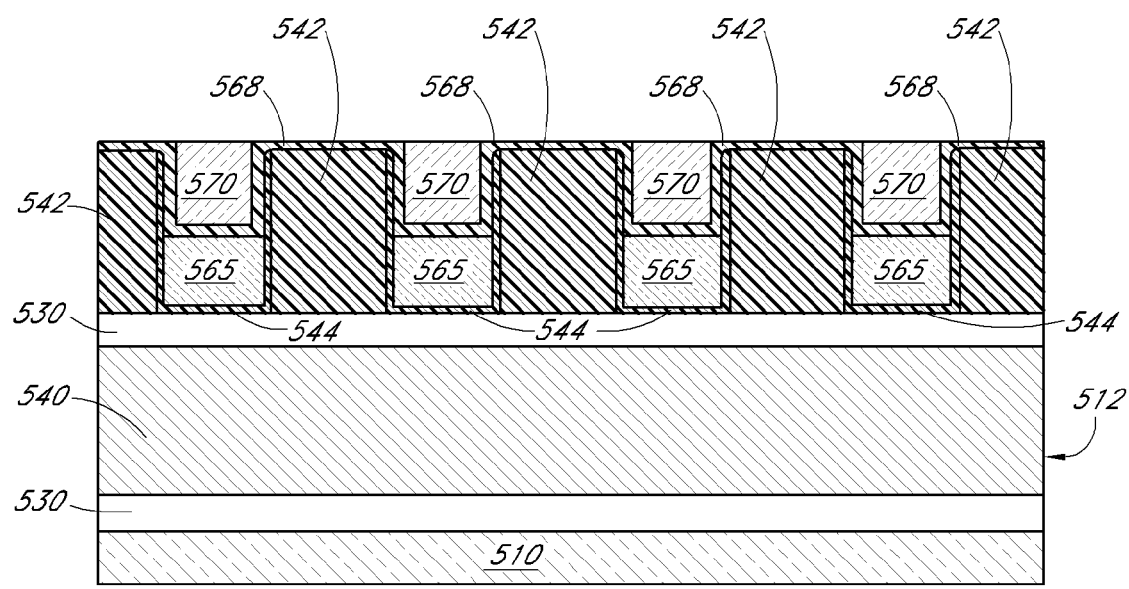
Figure 16A:
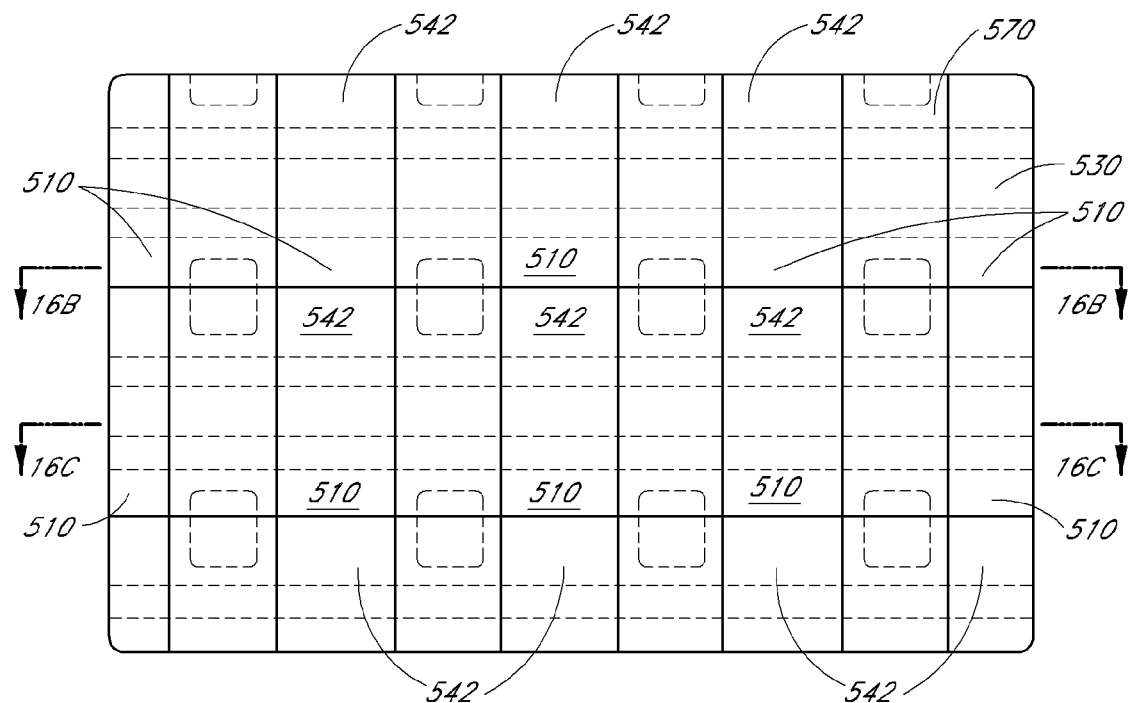
FIGS. 16A-16C schematically illustrate the memory array of FIG. 15A after re-patterning the first mask and etching to expose lower active areas.
Figure 16B:
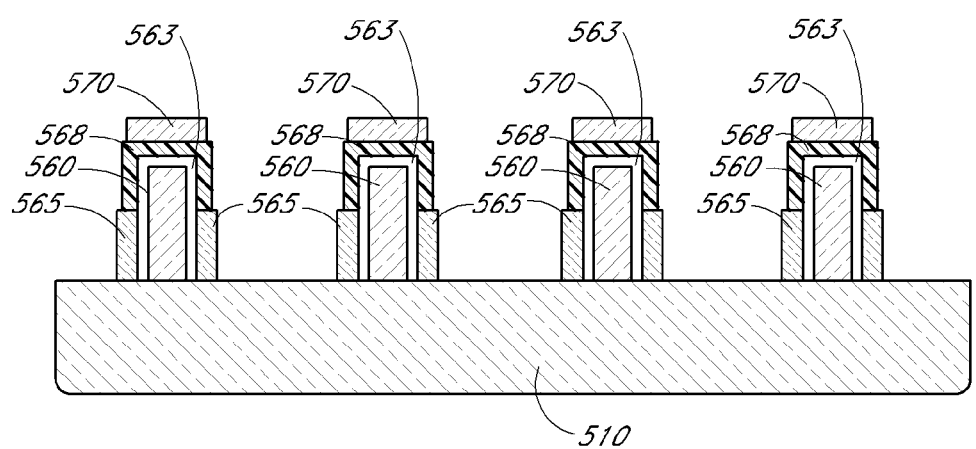
Figure 16C:
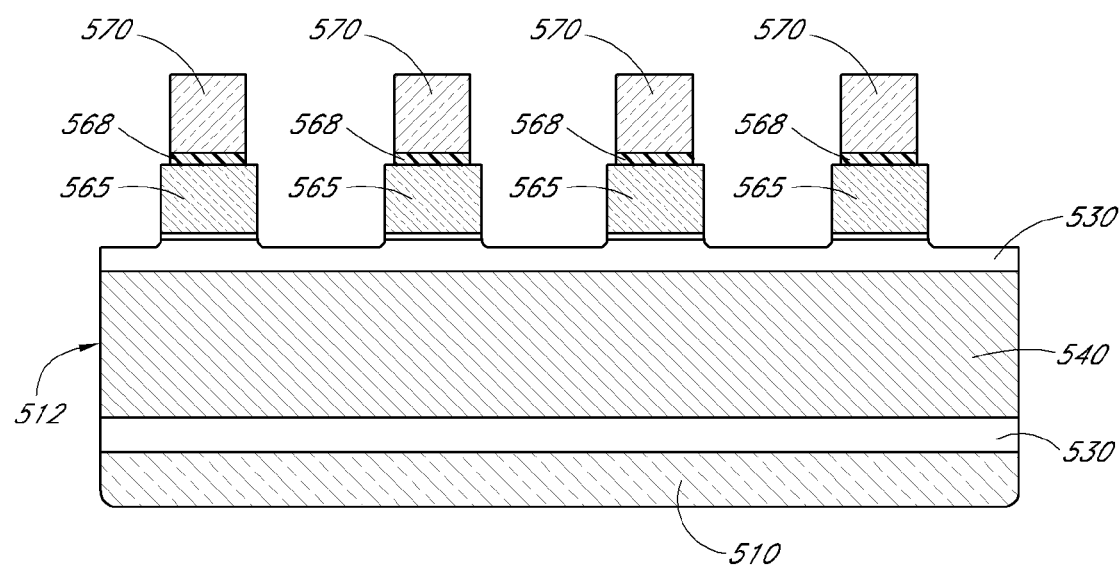

Referring now to FIGS. 15A-15C, a selective oxide etch has been performed to remove the spacer material 555 and the second mask material 550. The etch stops on the liner 544 or exposed bulk silicon from the substrate 510. The pillars 560 are then oxidized or a deposition conducted to form a gate dielectric 563 surrounding the epitaxially grown silicon pillar 560.

Word lines 565 are deposited between the mask lines 542 and surrounding the pillars 560 and the gate dielectric 563 in the spaces formerly occupied by the second mask material. Preferably, the word lines 565 are a conductive material, more preferably polysilicon. The word lines 565 are preferably recessed to a height of between about 800 Å and 1200 Å, more preferably between about 900 Å and 1100 Å. A soft oxidation is optionally performed to smooth the exposed word line material 565.

A liner 568, preferably nitride, is deposited over the array 502. The liner 568 has a thickness of between about 50 Å and 200 Å, more preferably 80 Å and 150 Å. A third hard mask material 570 is deposited over the surface of the array 502. Preferably, the third hard mask material 570 is polysilicon. A stop-on-nitride CMP step can be performed to planarize the surface of the array 502.

Next, a photoresist soft mask is formed, preferably perpendicular to the word lines 565, is formed over the array. Preferably, the soft mask covers a portion of the pillar 560. The exposed regions from the first mask material 542 are removed, leaving unexposed portions of the first mask material 542. The removal of this portion of the first mask material 542 results in the exposure of portions of the ridges 505 in the bulk substrate below the level of the pillars 560. The sacrificial hard mask layer 570 is used to protect the word lines and underlying materials during the nitride etch. The nitride etch preferably stops on the oxide 530 in the trench 512, but an overetch which exposes the buried digit line 540 should not cause substantial deleterious effects.

Referring now to FIGS. 17A-17E, a spacer 575 is deposited over the word lines 525 and the sacrificial hard mask 570. Preferably, the spacer 575 is an insulator such as a silicon oxide or silicon nitride layer, more preferably silicon nitride. The spacer 575 preferably has a thickness of between about 100 Å and 300 Å, more preferably between about 150 Å and 250 Å. The spacer 575 is used to provide a larger masking profile for an oxide etch that exposes the buried digit line 540 (see FIG. 17C). A spacer etch is performed to remove the spacer 575 from horizontal surfaces, such as the surface of the sacrificial hard mask 570 and the exposed portion of the oxide 530 which is over the buried digit line 540. Only a portion of the width of the buried digit line 540 is exposed due to the use of the third mask material 570 and the spacers 575 as masks, as best seen from the view of FIG. 17E.

The buried digit lines 540 can be exposed in one step or two depending on the materials used for the spacer 575 and the etch chemistries selected. In one example, the nitride spacer etch removes only nitride, stopping on the STI oxide 530. Exposed STI oxide 530 can then be removed by using either a dry plasma etch process or a wet etch process that etches oxides selective to the spacer 575 material and the buried digit line 540 material. Several etchants are available that etch oxide, but will not substantially etch nitrides and metals. Preferred wet etchants include diluted hydrofluoric acid. Preferred dry etchants to expose the buried digit lines 540 include fluorocarbon gases, such as $CH_xF_y$ gases. Skilled practitioners will appreciate that there are several methods to selectively etch oxide.

In the process of exposing the buried digit lines 540, a corner 577 (FIG. 17E) of the ridges 505 is preferably exposed. A dopant can be implanted or diffused to prepare the active areas 577 for their role in the transistor as the source/drain regions. Preferably, an n+ implant is performed after removing the spacer 575 from the surface of the active area 577. However, the doping process can also be performed before the formation of the spacer or after the formation of a connection material between the active area 577 and the buried digit line 540.

Figure 17A:
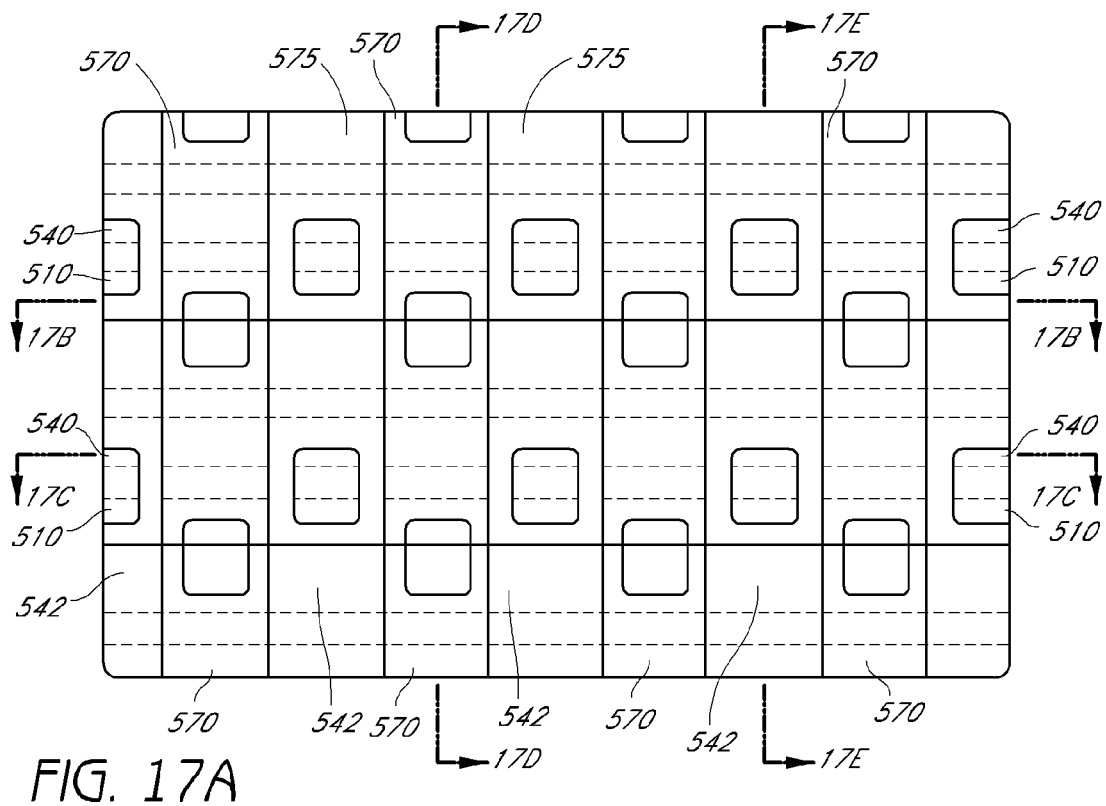
FIGS. 17A-17E schematically illustrate the memory array of FIG. 16A after exposing the digit line and depositing a spacer mask around the word lines.
Figure 17B:
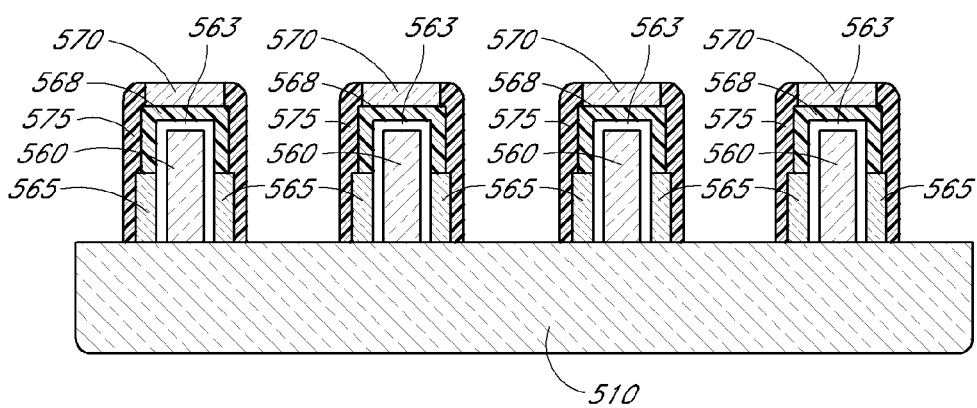
Figure 17C:
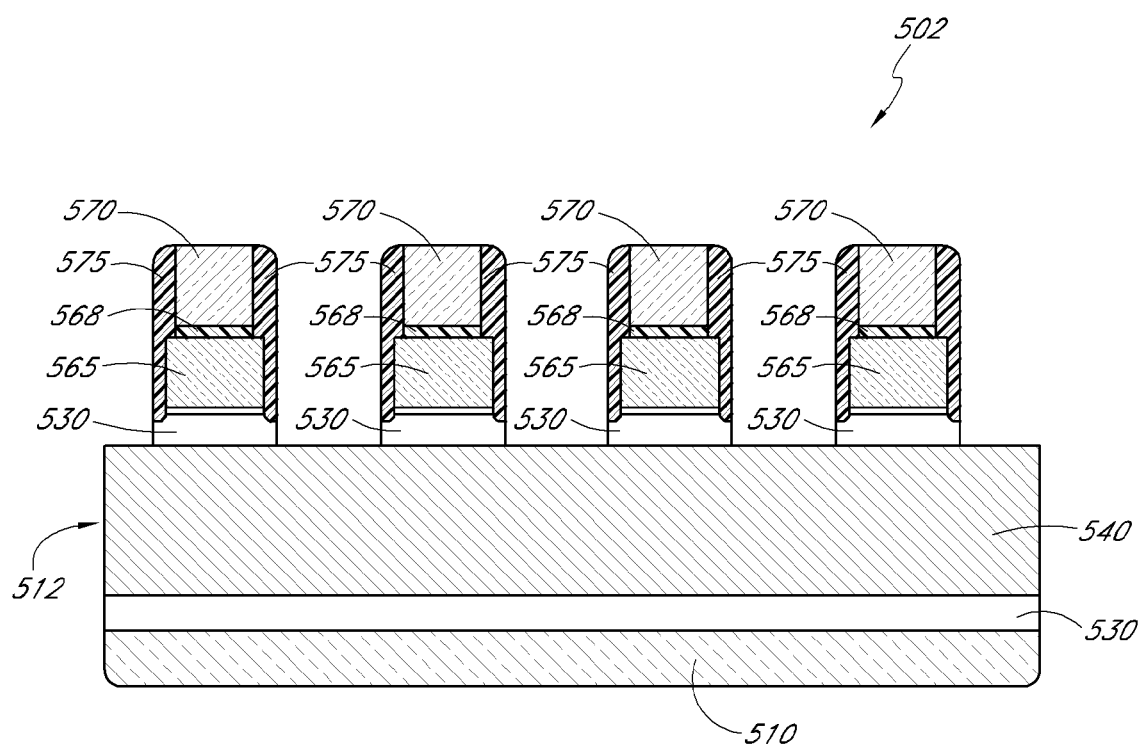
Figure 17D:
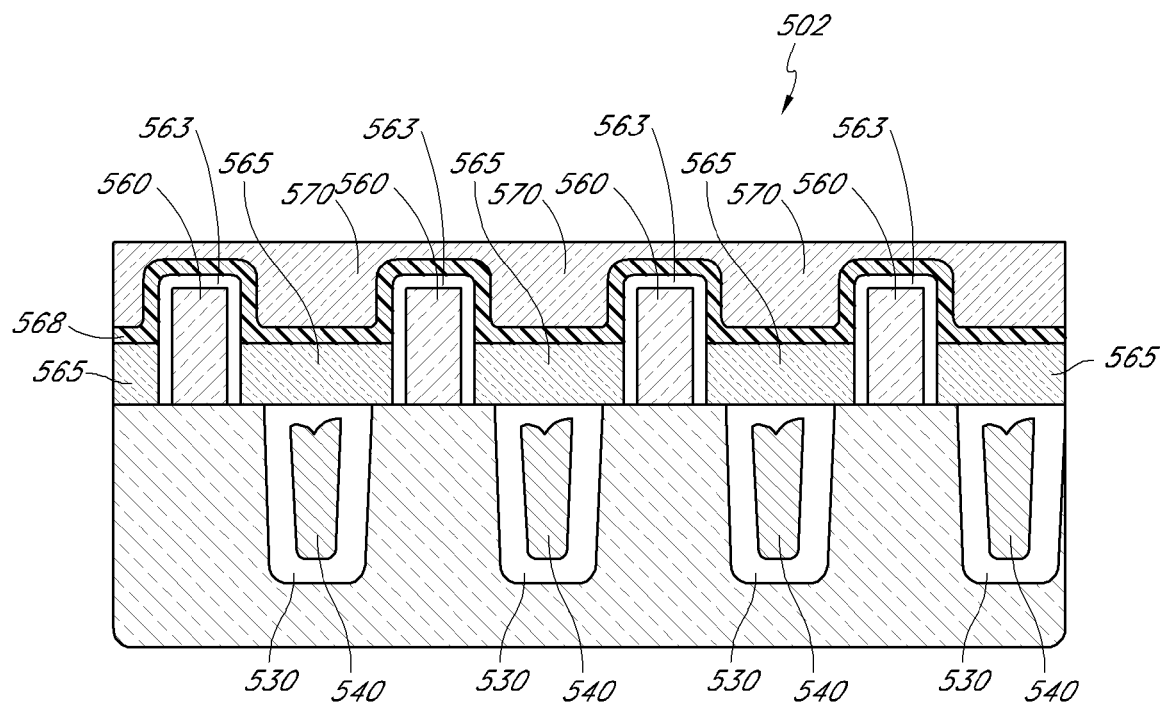
Figure 17E:
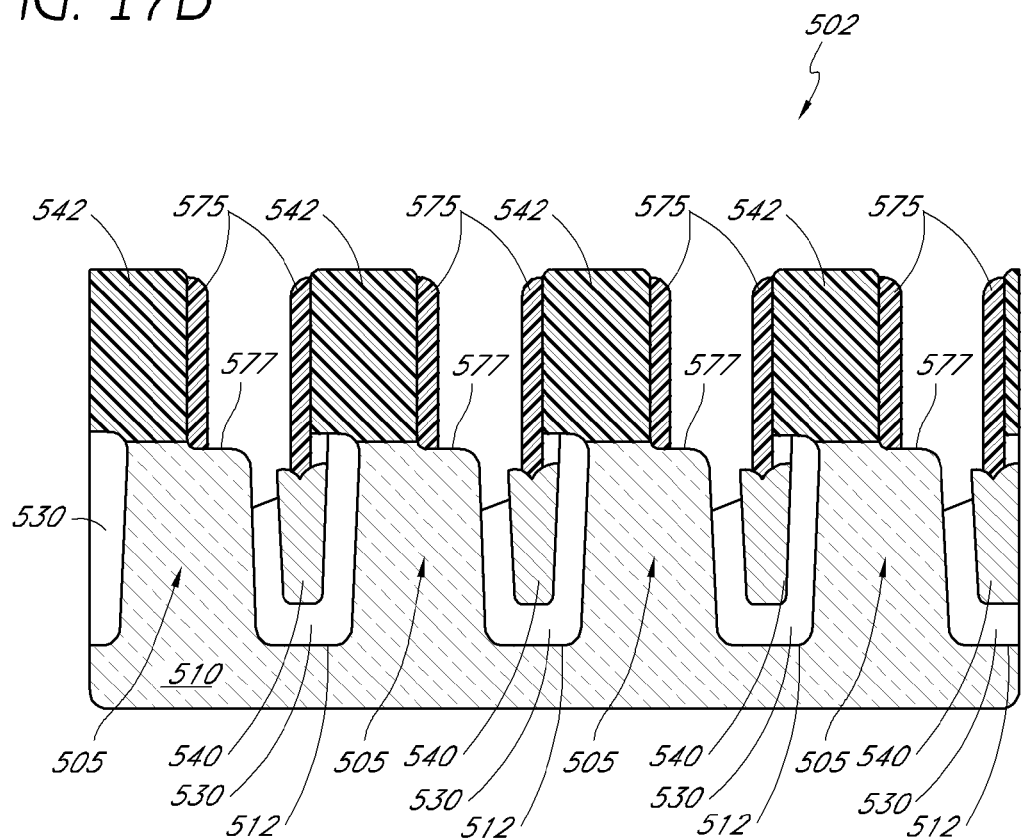

FIG. 17D shows the word lines 565 surrounding the silicon pillars 560. The sacrificial hard mask layer 570 and the liner 568 overlie the word lines 565. FIG. 17E shows the spacer 575 and the caps 543 and how they were used to expose only a portion of the buried digit line 540 and active areas 577 in the ridges 505.

Figure 18A:
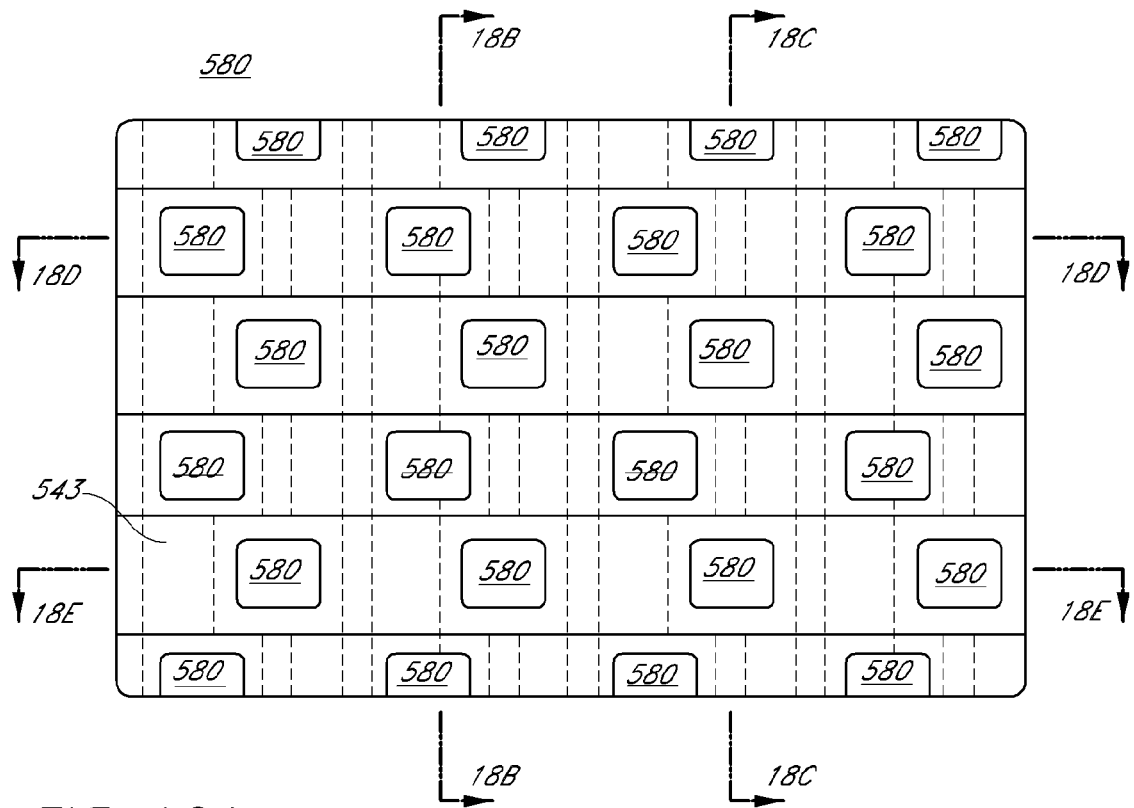
FIGS. 18A-18E schematically illustrate the memory array of FIG. 17A-17E after forming stitches connecting the digit line with a lower active area.
Figure 18B:
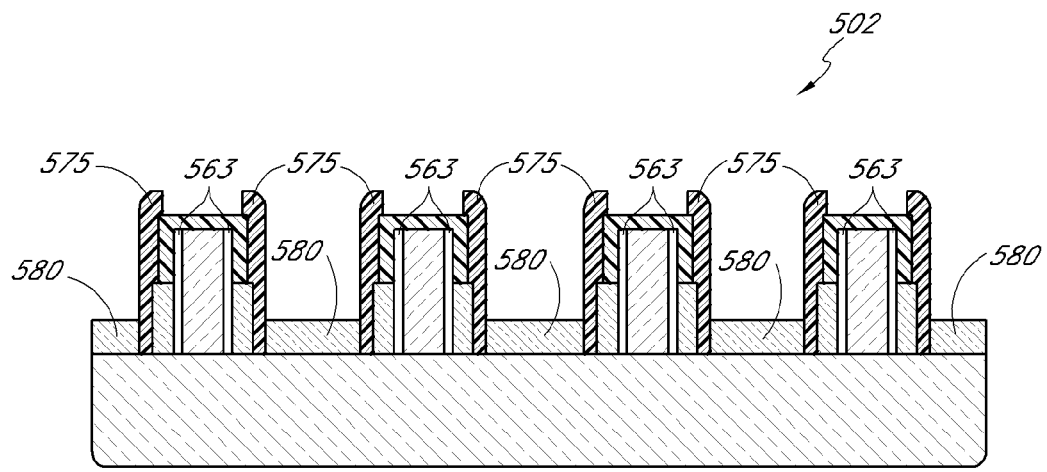
Figure 18C:
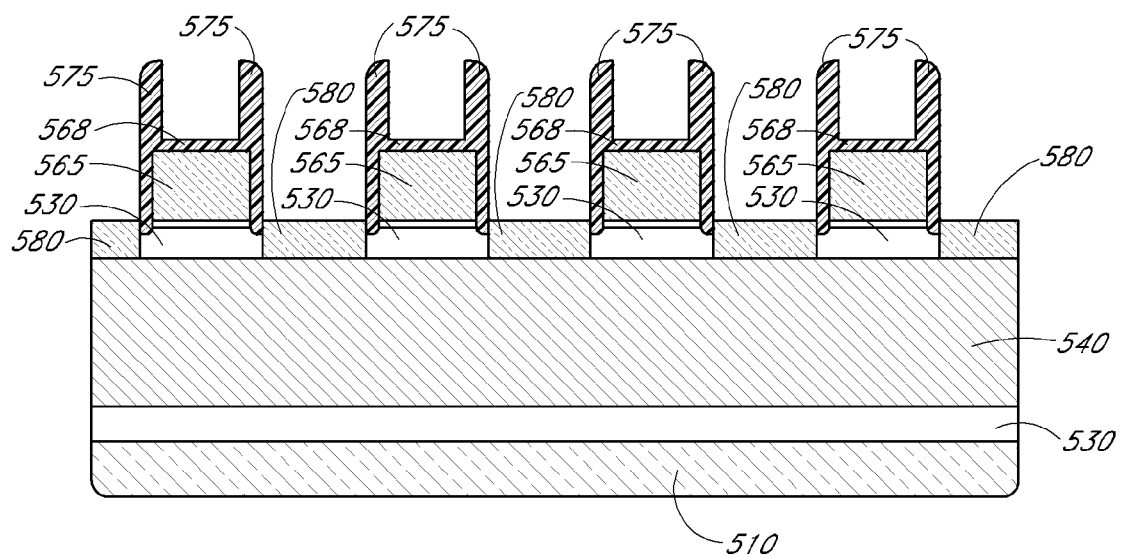
Figure 18D:
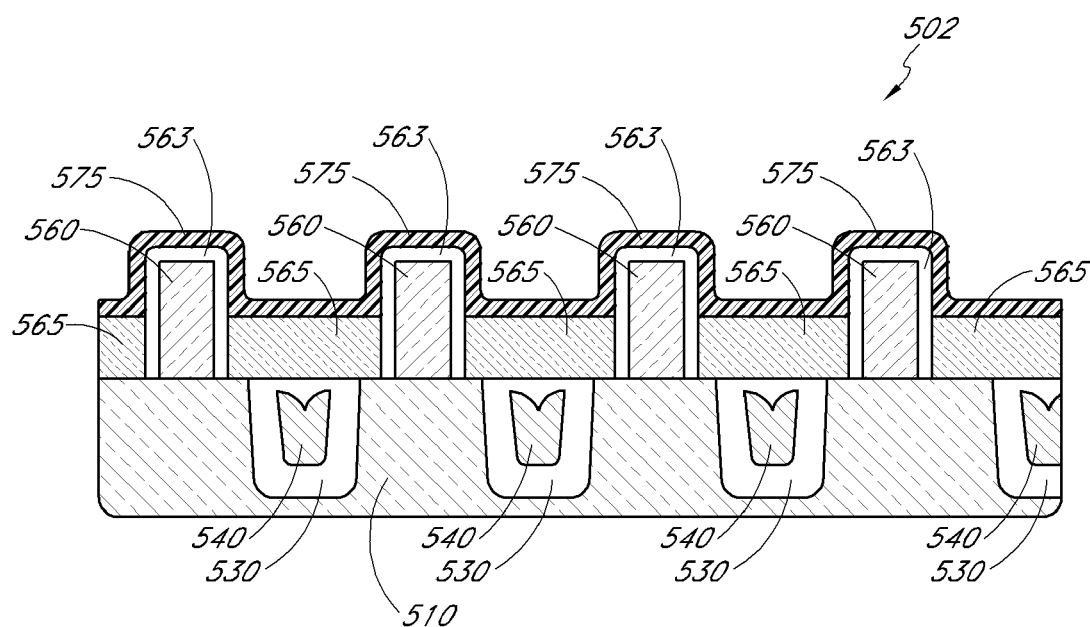
Figure 18E:
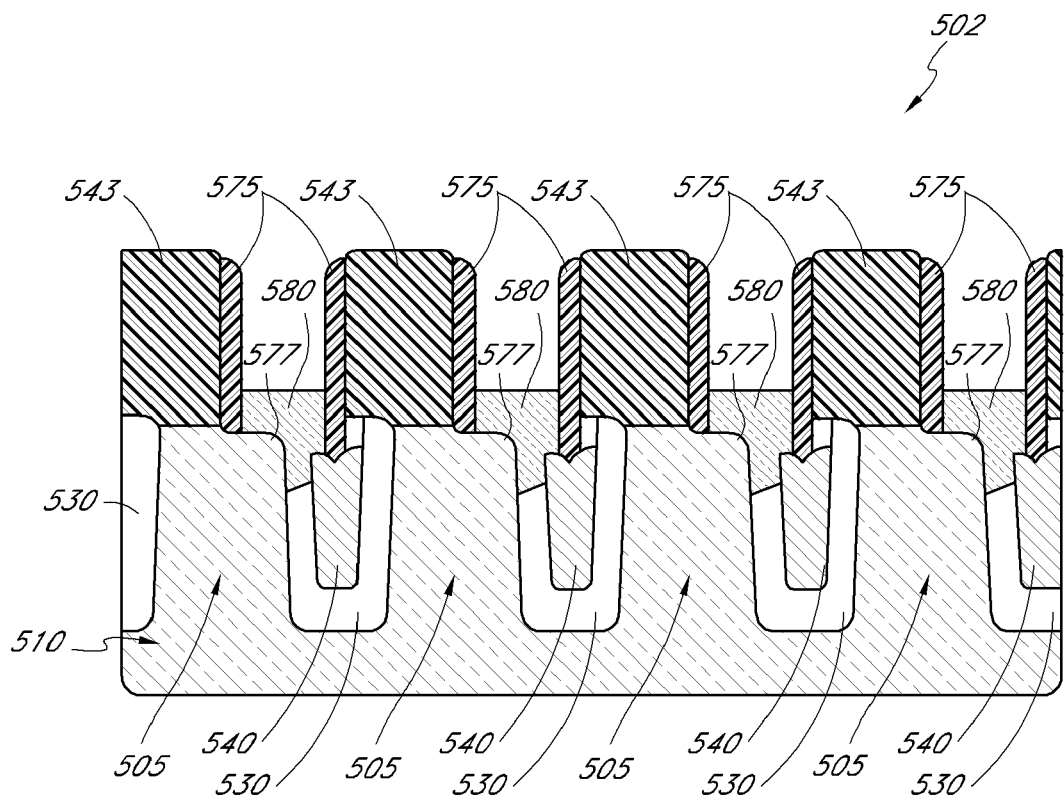

With reference to FIGS. 18A-18E, a blanket conductive material is deposited over the array 502 in order to form the buried digit line stitches 580. Preferably, the stitches 580 are polysilicon, more preferably doped polysilicon. FIGS. 18A-18E illustrate the array after the blanket deposition of conductive material and a subsequent recess of the conductive material to form the stitches 580. Preferably, a reactive ion etch (RIE) process is used to recess the conductive material to form conductive stitches 580 connecting the buried digit line 540 to the active area corners 577 in the ridges 505. Preferably, the RIE process does not substantially etch nitrides while it etches polysilicon. The RIE process preferably confines the stitches to a small area by removing the conductive material over various mask materials 542, 568, and 575, which are preferably nitride. These layers act as a mask for the deposition and formation of the stitches 580. Preferably, the stitches 580 are recessed to a height of between about 0 Å and 1000 Å over the active areas 577, more preferably between about 250 Å and 750 Å over the active areas 577 (FIG. 18B). The third hard mask material 570 is preferably removed by the RIE etch process which recesses the stitches 580. The recessed stitches 580 can be seen in FIG. 18B between the spacers 575. FIG. 18E shows the stitches 580 connecting the buried digit line 540 to the active areas 577.

An insulator 590 is then preferably deposited over the array 502. The insulator 590 is preferably an oxide, more preferably a TEOS oxide or a spin-on deposition (SOD) oxide. A stop-on-nitride CMP step is then performed to planarize the surface of the array 502.

Figure 19A:
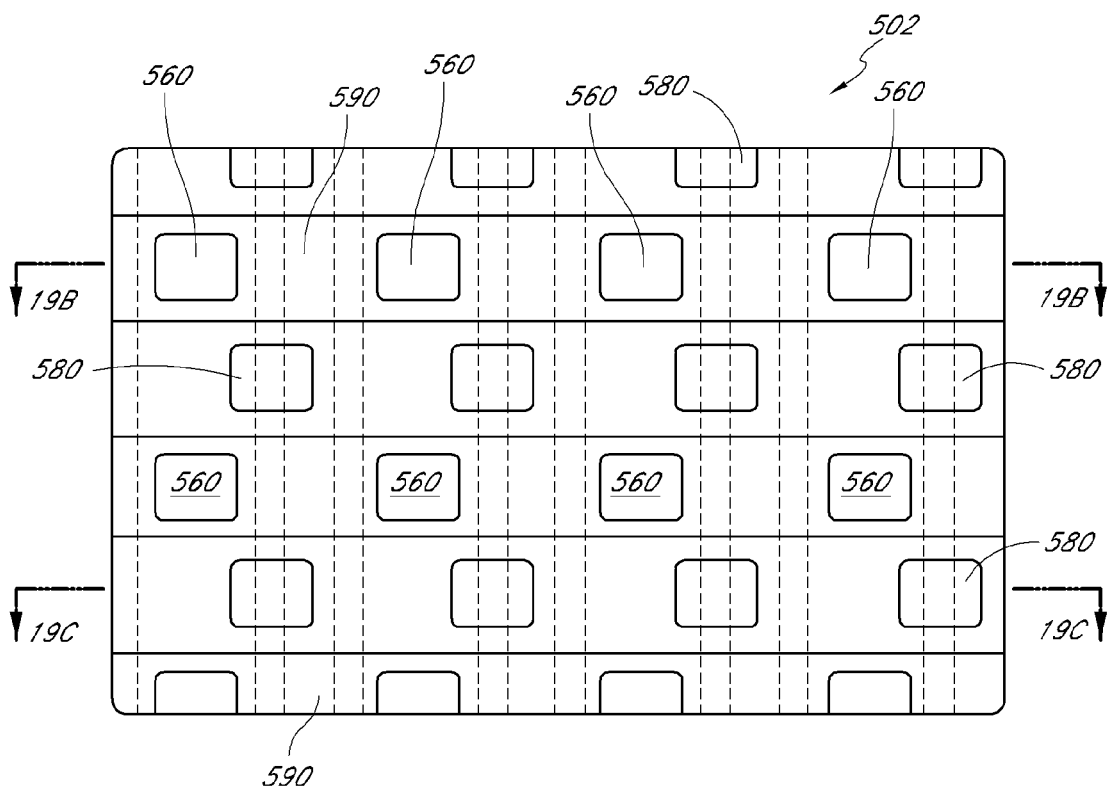
FIGS. 19A-19C schematically illustrate the memory array of FIG. 18A after the removal of insulating materials over the pillars.
Figure 19B:
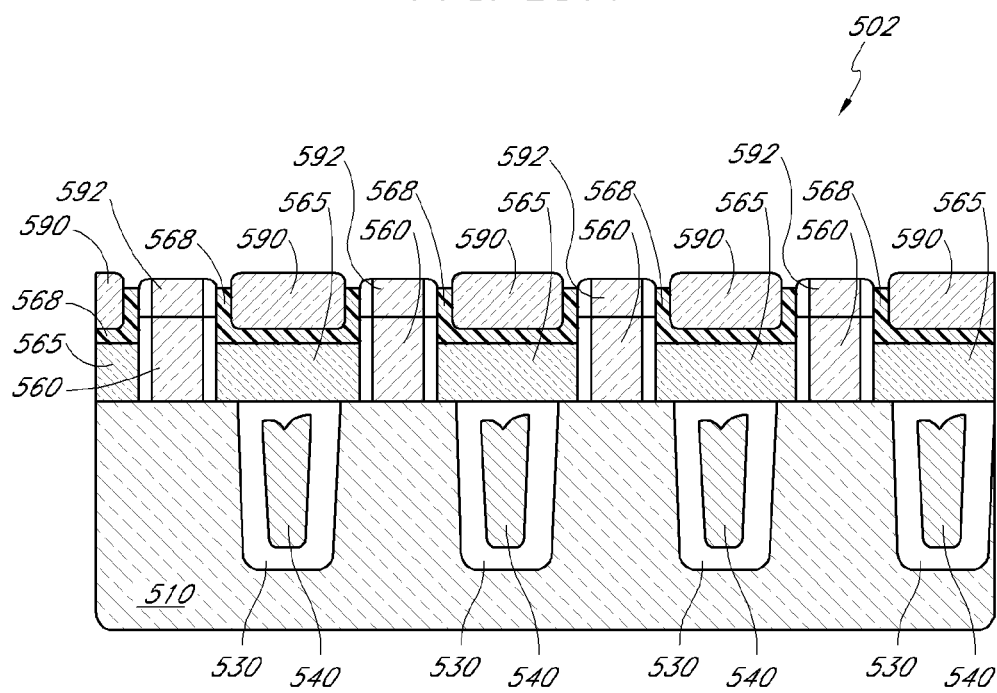
Figure 19C:
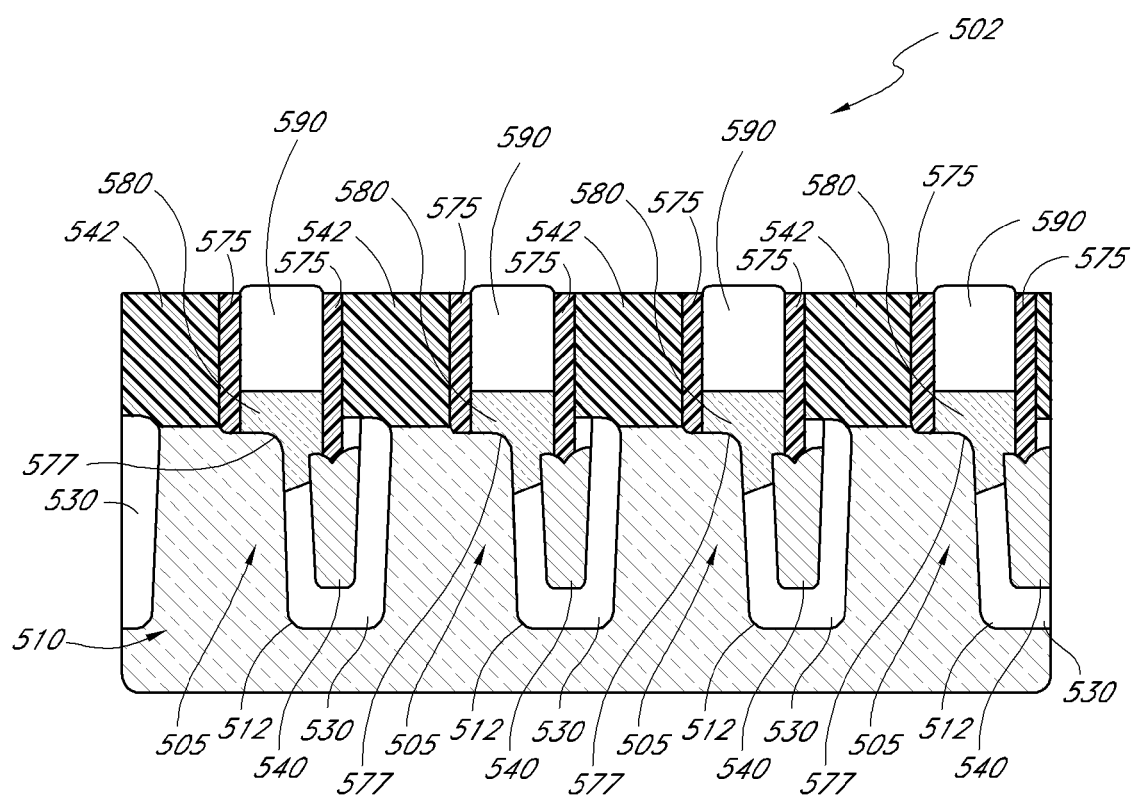

FIGS. 19A-19C illustrate the removal of the insulating materials over the pillars 560. Both the spacer 568 and the insulator 590 over the pillar 560 are removed in this step. In a preferred embodiment, a photoresist mask is formed over the surface of the array 502. A two step etch process can be used to contact the pillar 560. Preferably, the insulator 590 is recessed to the spacer 568 over the pillar 560. A nitride punch can then be performed to contact the top of the pillar 560, which is preferably the drain site and will serve as the cell capacitor contact. Preferred nitride punch processes include an in situ punch etch or a separate nitride punch etch after the resist is removed.

As above, once a cell capacitor contact is formed for the transistor, a capacitor can be formed over the pillar 560 in order to form a memory cell. An etch stop liner can be deposited over the exposed insulator 590. The cell capacitor is preferably a container electrode formed within a structural layer. Preferred materials for the bottom electrode 110 include polysilicon, tungsten, and titanium nitride. As discussed above, one preferred method for forming a bottom electrode is described in U.S. Pat. No. 6,756,627, issued to Wu, et al, which is previously incorporated by reference. Other methods of forming a capacitor are also available.

Structure of Transistors with Stitching Embodiment

The structure of the array of transistors can be seen in FIGS. 19A-19C. As seen in FIG. 19C, buried digit lines 540 are within a trench in a substrate isolated by a trench oxide 530. Transistor pillars 560 are formed above substrate ridges 505 between the isolation trenches. Word lines 565 overlie the substrate 510, in which lower active areas 577 are formed. The buried digit lines 540 are connected to individual transistor lower active areas 577 by individual connection stitches 580. Preferably the stitches 580 are polysilicon, more preferably n-doped polysilicon. The word lines 565 surround the epitaxially-grown silicon pillars 560 (see FIG. 19B). The tops of the pillars 560 are preferably n-doped for use as an upper active area 592. In a preferred embodiment the upper active area 592 serves as the drain of the transistor. The pillar 560 is preferably epitaxially grown silicon, but it could also be etched from the substrate. Other materials can also be used in forming the vertical transistor.

In a preferred embodiment, the transistor is used in a memory cell for a memory device such as a DRAM. A stacked capacitor is formed over the pillar 560. The top of the pillar may act as a cell capacitor contact, or a separate cell capacitor contact can be formed over the pillar 560. A cell capacitor is formed over each pillar 560. Preferably the cell capacitor is a container capacitor, which comprises a lower electrode electrically connected to the vertical transistor, preferably through the pillar 560. A capacitor dielectric, such as a metal oxide, is formed over the container capacitor lower electrode. An upper electrode is formed over the capacitor dielectric. In a preferred embodiment, the capacitor dielectric and the upper electrode are common to the entire array.

Although the foregoing invention has been described with reference to certain exemplary embodiments, other embodiments will become apparent in view of this disclosure. Therefore, the described embodiments are to be considered only as illustrative and not restrictive. The scope of the present invention, therefore, is indicated by the appended claims and their combination in whole or in part rather than by the foregoing description. All changes thereto would come within the meaning and range of the equivalence of the claims are to be embraced within their scope.

We claim:

1. A memory array comprising:
    a substrate having a plurality of ridges separating a plurality of trenches, each ridge extending from a bottom level of the trenches to a shoulder of the ridge, wherein the shoulder of the ridge defines an upper surface of the ridge, and each trench extending from the bottom level to the shoulder;
    a bit line buried below the shoulder within each trench;
    a plurality of transistor pillars over each of the plurality of ridges, each transistor pillar extending upwardly from the shoulder of the ridge, wherein the transistor pillars include an upper active area;
    a plurality of lower active areas in the upper surface of each of the plurality of ridges, wherein one of the lower active areas is below each transistor pillar;
    a bit line link within each trench connecting each lower active area and the bit line; and
    a plurality of word lines, wherein each word line contacts a row of transistor pillars and crosses over at least two of the plurality of ridges.

2. The array of claim 1, further comprising cell capacitors over and electrically connected to each upper active area.

3. The array of claim 1, wherein the transistor pillars comprise epitaxial silicon.

4. The array of claim 1, wherein the transistor pillars comprise bulk silicon.

5. The array of claim 1, wherein the transistor pillars have a height of between about 1000 Å and 2000 Å.

6. The array of claim 1, wherein the bit line link comprises a strap connecting one bit line to the active areas within one ridge.

7. The array of claim 1, wherein the bit line link comprises a plurality of stitches connecting one bit line to one of the plurality of active areas.

8. The array of claim 1, wherein the gate comprises a word line that defines a connection between neighboring pillars.

9. The array of claim 1, wherein each transistor pillar is surrounded by a gate dielectric.

10. The array of claim 1, wherein each row of transistors comprises a staggered row of transistors.

11. A vertical transistor for an integrated circuit, comprising:
    a buried bit line within a trench in a bulk semiconductor substrate;
    a transistor pillar formed over a ridge in the semiconductor substrate, wherein the ridge is adjacent to the trench and extends from a bottom level of the trench to a shoulder of the ridge, wherein the shoulder of the ridge defines an upper surface of the ridge, wherein the transistor pillar extends upwardly from the shoulder of the ridge, wherein the trench extends from the bottom level to the shoulder, and wherein the buried bit line is below the shoulder within the trench;
    a bit line link in the trench connecting the buried bit line to a lower active area in the ridge; and
    a conductive gate surrounding the transistor pillar.

12. The transistor of claim 11, wherein the bit line link is an individual bit line stitch connecting the lower active area in the ridge to the bit line.

13. The transistor of claim 11, wherein the bit line link is a bit line strap running beside the bit line in the trench.

14. The transistor of claim 11, wherein the bit line link comprises doped polysilicon.

15. The transistor of claim 11, wherein the conductive gate comprises a word line configured to connect a plurality of transistors.

16. The transistor of claim 11, wherein the conductive gate comprises polysilicon.

17. The transistor of claim 11, wherein the pillar has a height of between about 1000 Å and 2000 Å above the shoulder of the ridge.

18. The transistor of claim 11, wherein the buried bit line comprises a metal compound.

19. The transistor of claim 11, wherein the transistor is formed from the bulk semiconductor substrate.

* * * * *